(12) United States Patent
Mui et al.

(10) Patent No.: US 8,942,047 B2
(45) Date of Patent: Jan. 27, 2015

(54) BIT LINE CURRENT TRIP POINT MODULATION FOR READING NONVOLATILE STORAGE ELEMENTS

(71) Applicant: Sandisk Technologies Inc., Plano, TX (US)

(72) Inventors: Man L. Mui, Santa Clara, CA (US); Teruhiko Kamei, Yokohama (JP); Yingda Dong, San Jose, CA (US); Ken Oowada, Fujisawa (JP); Yosuke Kato, Kamakura (JP); Fumitoshi Ito, Yokohama (JP); Seungpil Lee, San Ramon, CA (US)

(73) Assignee: Sandisk Technologies Inc., Plano, TX (US)

(*) Notice: Subject to any disclaimer, the term of this patent is extended or adjusted under 35 U.S.C. 154(b) by 0 days.

(21) Appl. No.: 14/290,891

(22) Filed: May 29, 2014

(65) Prior Publication Data
US 2014/0269083 A1    Sep. 18, 2014

Related U.S. Application Data

(63) Continuation of application No. 13/754,852, filed on Jan. 30, 2013.

(51) Int. Cl.
*G11C 16/06* (2006.01)
*G11C 16/28* (2006.01)
(Continued)

(52) U.S. Cl.
CPC ............ *G11C 16/28* (2013.01); *G11C 11/5642* (2013.01); *G11C 16/26* (2013.01); *G11C 2211/5621* (2013.01)

USPC ... 365/185.21; 365/222; 365/63; 365/230.01; 365/233.11; 365/241

(58) Field of Classification Search
CPC .......... G11C 2207/104; G11C 11/406; G11C 11/4087; G11C 29/028; G11C 29/50012; G11C 11/4076; G11C 7/22
USPC ................. 365/222, 63, 191, 230.01, 233.11, 365/233.12, 241
See application file for complete search history.

(56) References Cited

U.S. PATENT DOCUMENTS 6,434,736 B1   8/2002   Schaecher
6,470,304 B1  10/2002   Mali
(Continued)

FOREIGN PATENT DOCUMENTS

EP    0306712 B1   12/1993

OTHER PUBLICATIONS

U.S. Appl. No. 13/754,852, Mui et al., filed Jan. 30, 2013.*
(Continued)

*Primary Examiner* — Thong Q Le
(74) *Attorney, Agent, or Firm* — Vierra Magen Marcus LLP

(57) ABSTRACT

Upon selecting non-volatile storage elements to be sensed, the system obtains information about the position of these non-volatile storage elements, determines sensing parameters based at least in part on this information, pre-charges a charge storage device and, while maintaining the voltage level of the bit lines of these memory cells at a constant value, applies a reference signal to these non-volatile storage elements for a certain duration of time, afterwards determining whether, for the certain duration of time, the current conducted by these non-volatile storage elements exceeds a pre-determined value.

18 Claims, 28 Drawing Sheets

(51) Int. Cl.
　　*G11C 11/56*　　(2006.01)
　　*G11C 16/26*　　(2006.01)

(56) References Cited

U.S. PATENT DOCUMENTS

| | | | |
|---|---|---|---|
| 6,697,288 | B2 | 2/2004 | Kim |
| 6,888,758 | B1 | 5/2005 | Hemink |
| 7,002,843 | B2 | 2/2006 | Guterman |
| 7,020,026 | B2 | 3/2006 | Guterman |
| 7,057,958 | B2 | 6/2006 | So |
| 7,092,290 | B2 | 8/2006 | Hemink |
| 7,391,650 | B2 | 6/2008 | Mokhlesi |
| 7,411,830 | B2 | 8/2008 | Takeuchi |
| 7,436,724 | B2 | 10/2008 | Nandi |
| 7,450,433 | B2 | 11/2008 | Wan |
| 7,463,528 | B2 | 12/2008 | Mokhlesi |
| 7,551,477 | B2 | 6/2009 | Mokhlesi |
| 7,583,535 | B2 | 9/2009 | Sekar |
| 7,755,946 | B2 | 7/2010 | Dunga |
| 7,855,922 | B2 | 12/2010 | Doyle |
| 7,974,133 | B2 | 7/2011 | Dunga |
| 7,974,134 | B2 | 7/2011 | Zhang |
| 8,102,729 | B2 | 1/2012 | Lee |
| 8,582,381 | B2 | 11/2013 | Oowada |
| 2003/0189856 | A1 | 10/2003 | Cho |
| 2005/0169082 | A1 | 8/2005 | Cernea |
| 2008/0247253 | A1 | 10/2008 | Nguyen |
| 2010/0008151 | A1 | 1/2010 | Hwang |
| 2010/0027337 | A1 | 2/2010 | Park |
| 2010/0264547 | A1 | 10/2010 | Yanagidaira |
| 2011/0205823 | A1 | 8/2011 | Hemink |
| 2011/0235420 | A1 | 9/2011 | Sharon |
| 2012/0063195 | A1 | 3/2012 | Lam |
| 2014/0036601 | A1 | 2/2014 | Oowada |

OTHER PUBLICATIONS

U.S. Appl. No. 13/754,852, filed Jan. 30, 2013.
Office Action dated Apr. 30, 2014, U.S. Appl. No. 13/754,852.
Response to Office Action dated Sep. 2, 2014, U.S. Appl. No. 13/754,852.
Notice of Allowance dated Sep. 19, 2014, U.S. Appl. No. 13/754,852.
PCT International Search Report dated Jul. 15, 2014, PCT Patent Application No. PCT/US2014/013513.
PCT Written Opinion of the International Searching Authority dated Jul. 15, 2014, PCT Patent Application No. PCT/US2014/013513.

\* cited by examiner

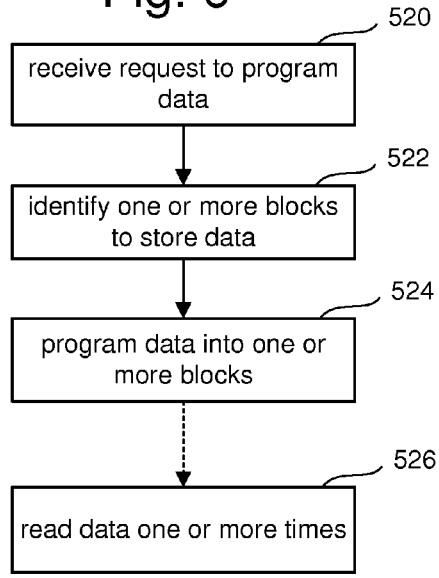
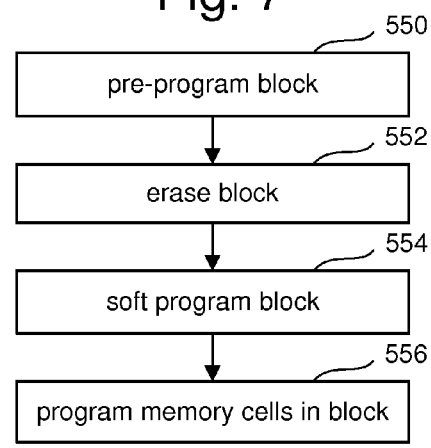

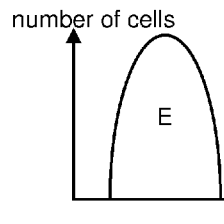
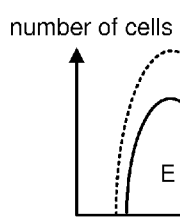
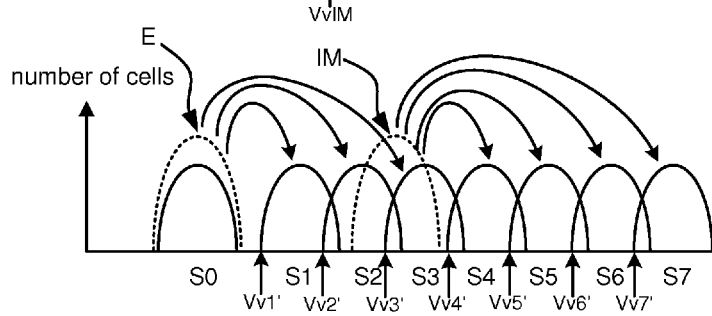
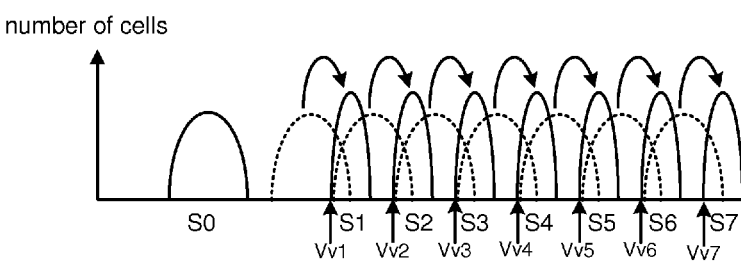
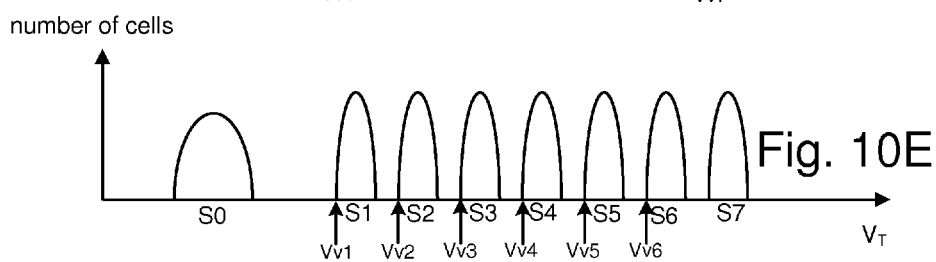
Fig. 10A
Fig. 10B
Fig. 10C
Fig. 10D
Fig. 10E

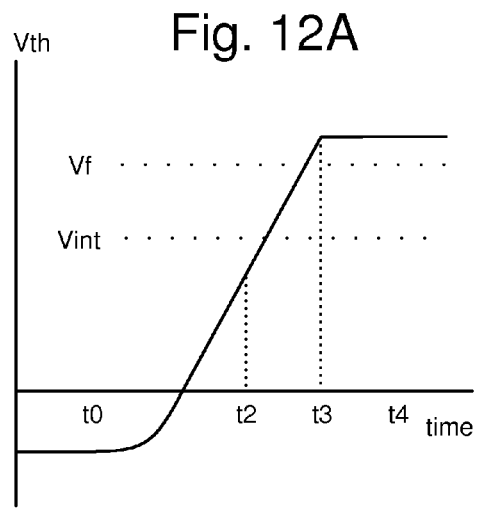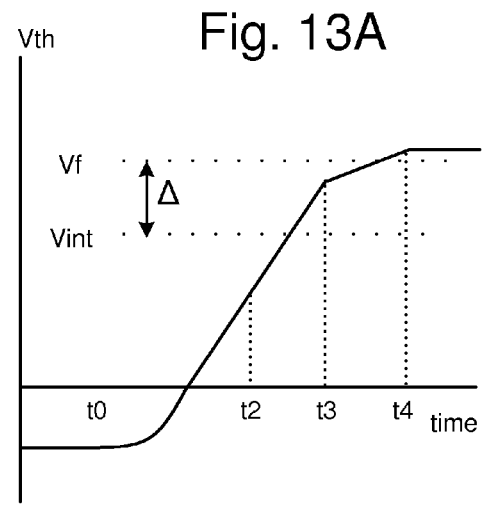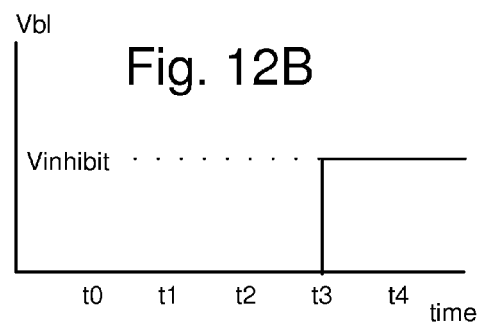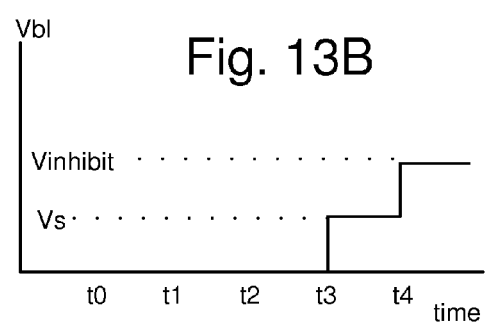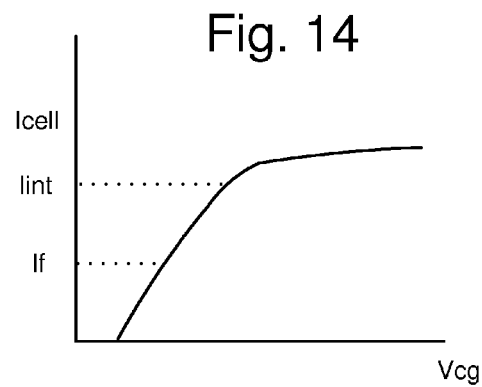

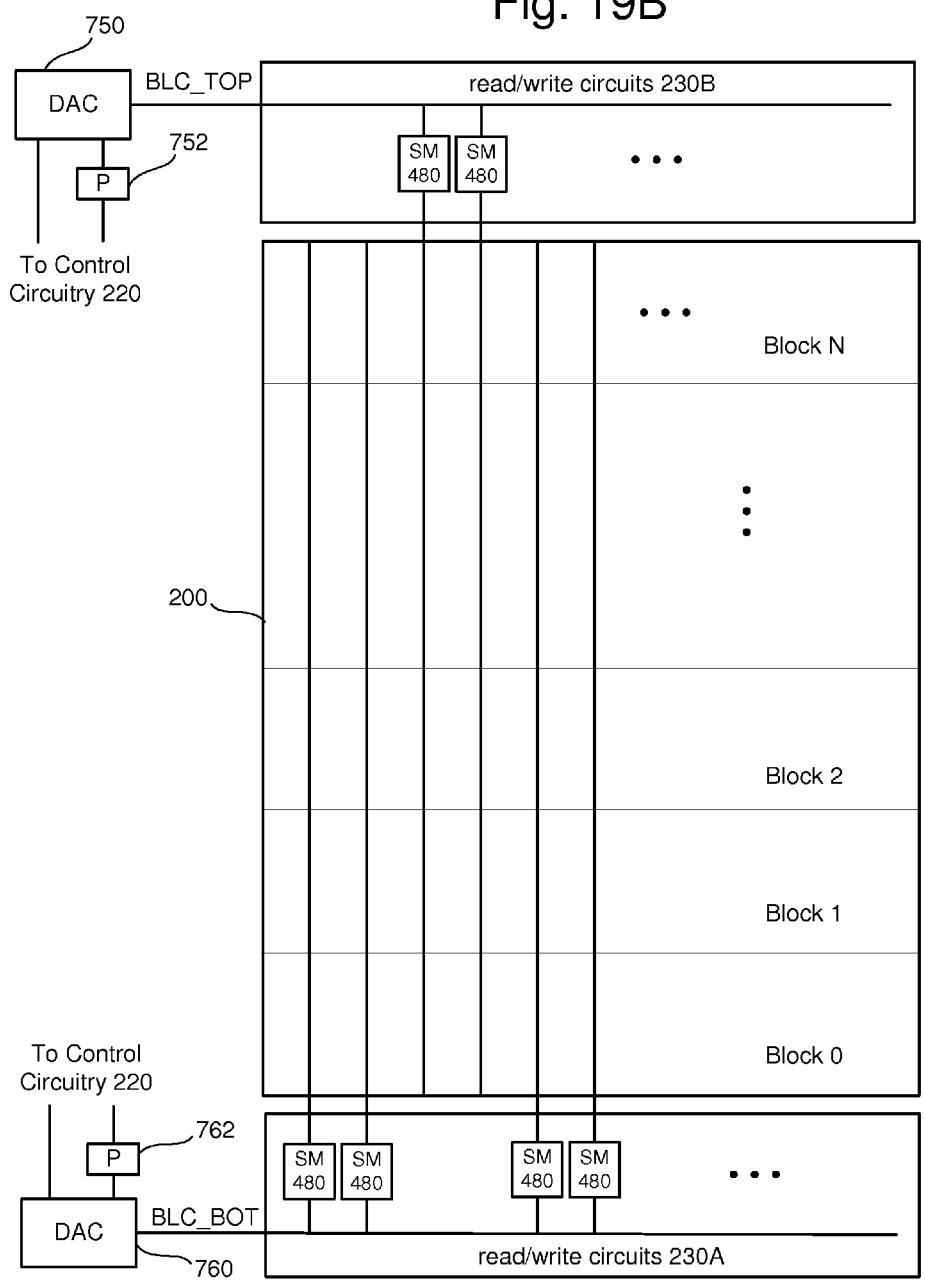

BIT LINE CURRENT TRIP POINT MODULATION FOR READING NONVOLATILE STORAGE ELEMENTS

This application is a continuation of U.S. patent application Ser. No. 13/754,852, entitled, "Bit Line Current Trip Point Modulation For Reading Nonvolatile Storage Elements," filed on Jan. 30, 2013, which is incorporated herein by reference in its entirety.

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Typically, the program voltage (Vpgm) is applied to the control gates of the memory cells as a series of pulses. The magnitude of the pulses is increased with each successive pulse by a predetermined step size (e.g. 0.2 v, 0.3 v, 0.4 v, or others). In the periods between the pulses, verify operations are carried out. That is, the programming level of each memory cell of a group of memory cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising their respective bit line voltage to stop the programming process for those memory cells. The above described techniques, and others described herein, can be used in combination with various boosting techniques to prevent program disturb and with various efficient verify techniques known in the art.

As the size of the circuit elements get smaller, the bit line resistances get larger. A large bit line resistance has an impact on the verify process.

DESCRIPTION OF THE DRAWINGS

FIG. 6 is a flow chart describing one embodiment of a process for programming.
FIG. 7 is a flow chart describing one embodiment of a process for programming data into a block of memory cells.
FIGS. 10A-E show various threshold voltage distributions and describe a process for programming non-volatile memory.
FIGS. 12A, 12B, 13A, and 13B are graphs of threshold voltage versus time that describe one embodiment of coarse/fine programming.
FIG. 14 is a graph of memory cell current versus control gate voltage.
FIGS. 19A-B show exemplary arrangements of memory blocks with respect to other circuitry on a memory system.

DETAILED DESCRIPTION

One embodiment for verifying programming is to test the current through the memory cell in response to applying a reference signal to the control gate of the memory cell. This testing of the current through the memory cell can be dynamically adjusted based on the position of the memory cell with respect to sensing circuits in order to account for variances in bit line resistance. For example, testing of the current through the memory cell may include discharging a capacitor or other charge storage device through the memory cell, and dynamically adjusting the testing may include changing the test time period or test voltage compared against the capacitor. Other variations in the testing may also be used. In one example implementation, the farther a memory cell is from its corresponding sense amplifier, the shorter the test period or the smaller the change in voltage of the capacitor tested for.

Figure 1:
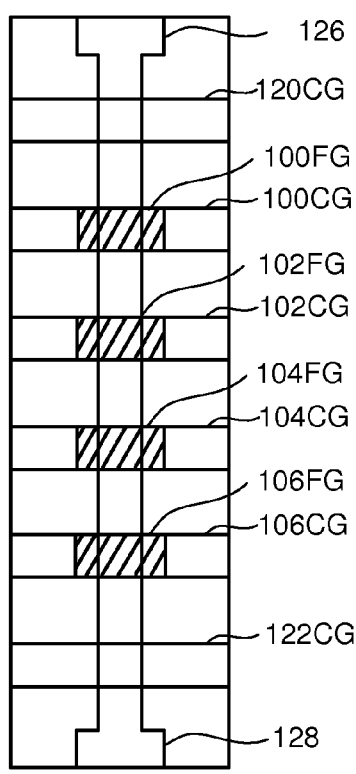
FIG. 1 is a top view of a NAND string.
Figure 2:
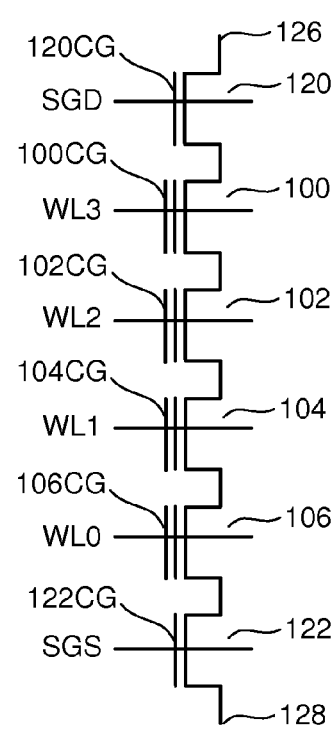
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
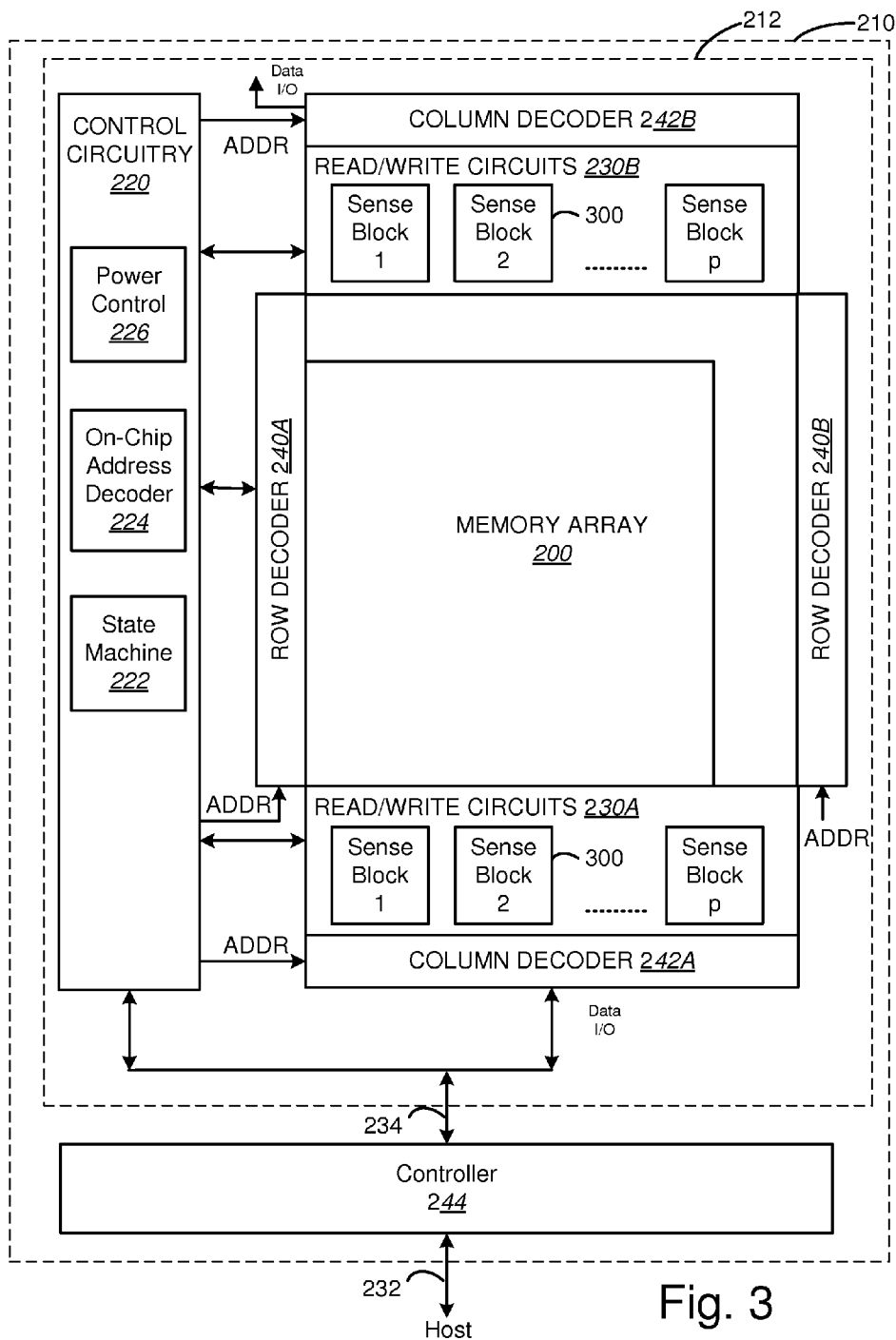
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
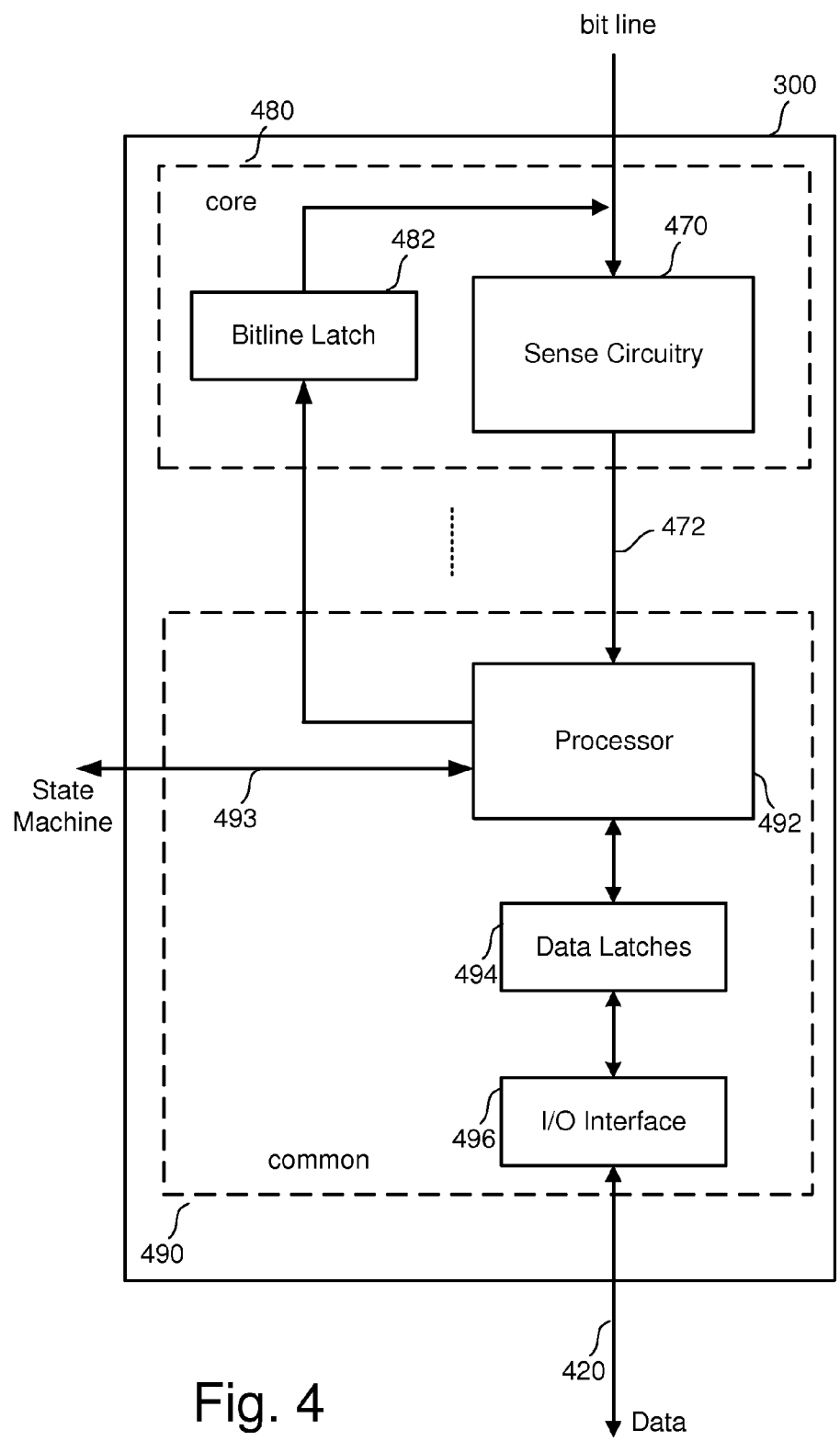
FIG. 4 is a block diagram of a non-volatile memory system.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
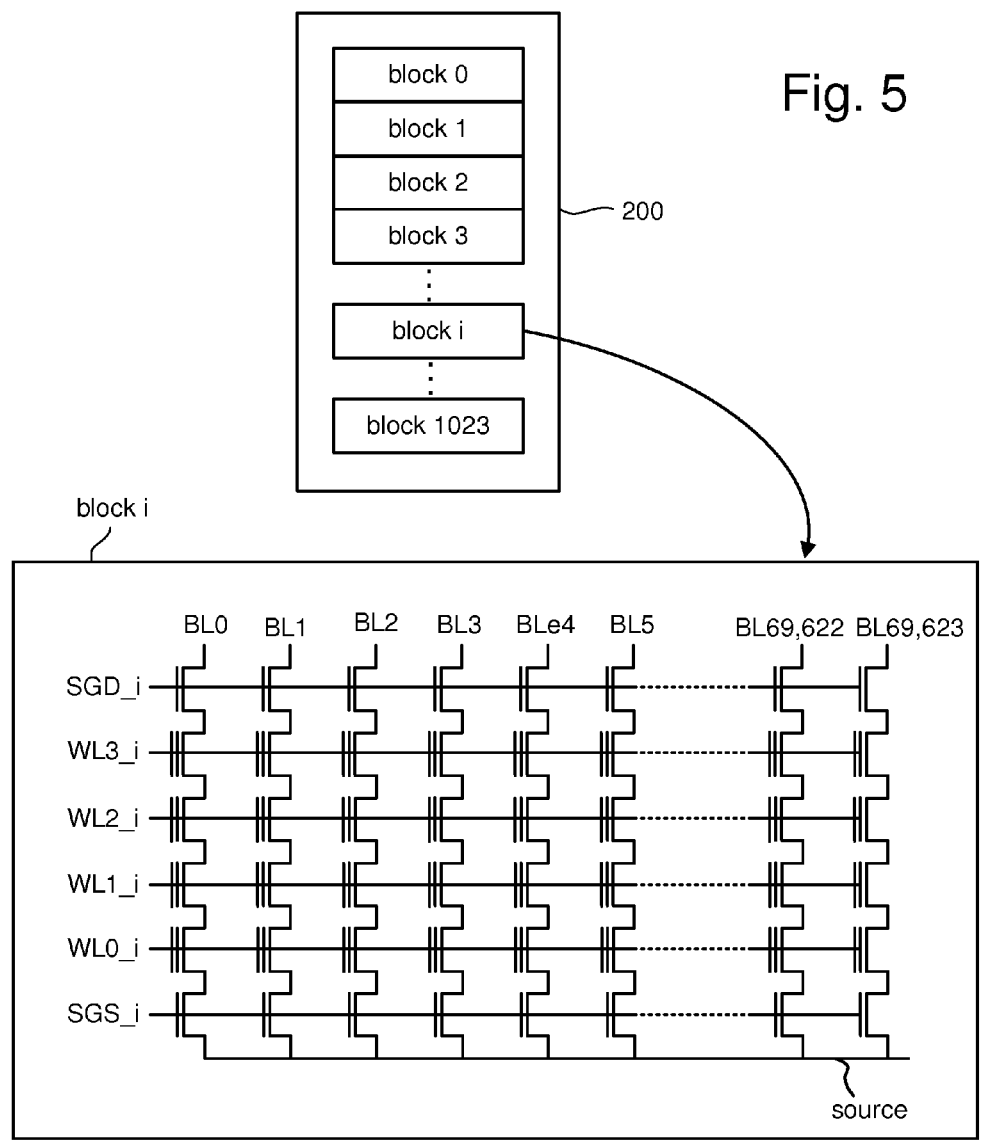
FIG. 5 depicts an exemplary structure of a memory cell array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associated with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for programming. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
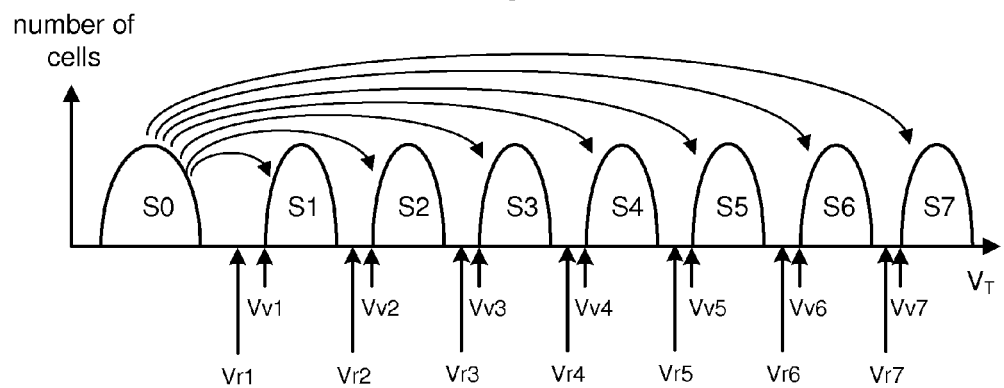
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
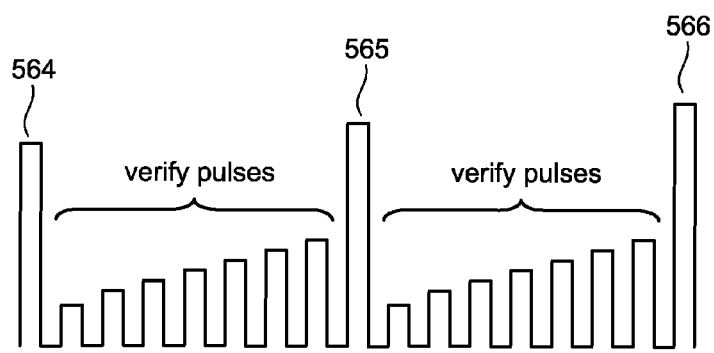
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state 1M to data state S7, those memory cells targeted to be in data state S6 are programmed from intermediate state IM to data state S6, both memory cells to be programmed to data state S5 are programmed from intermediate state 1M to data state S5, and those memory cells to be programmed to data state S4 are programmed from intermediate state 1M to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
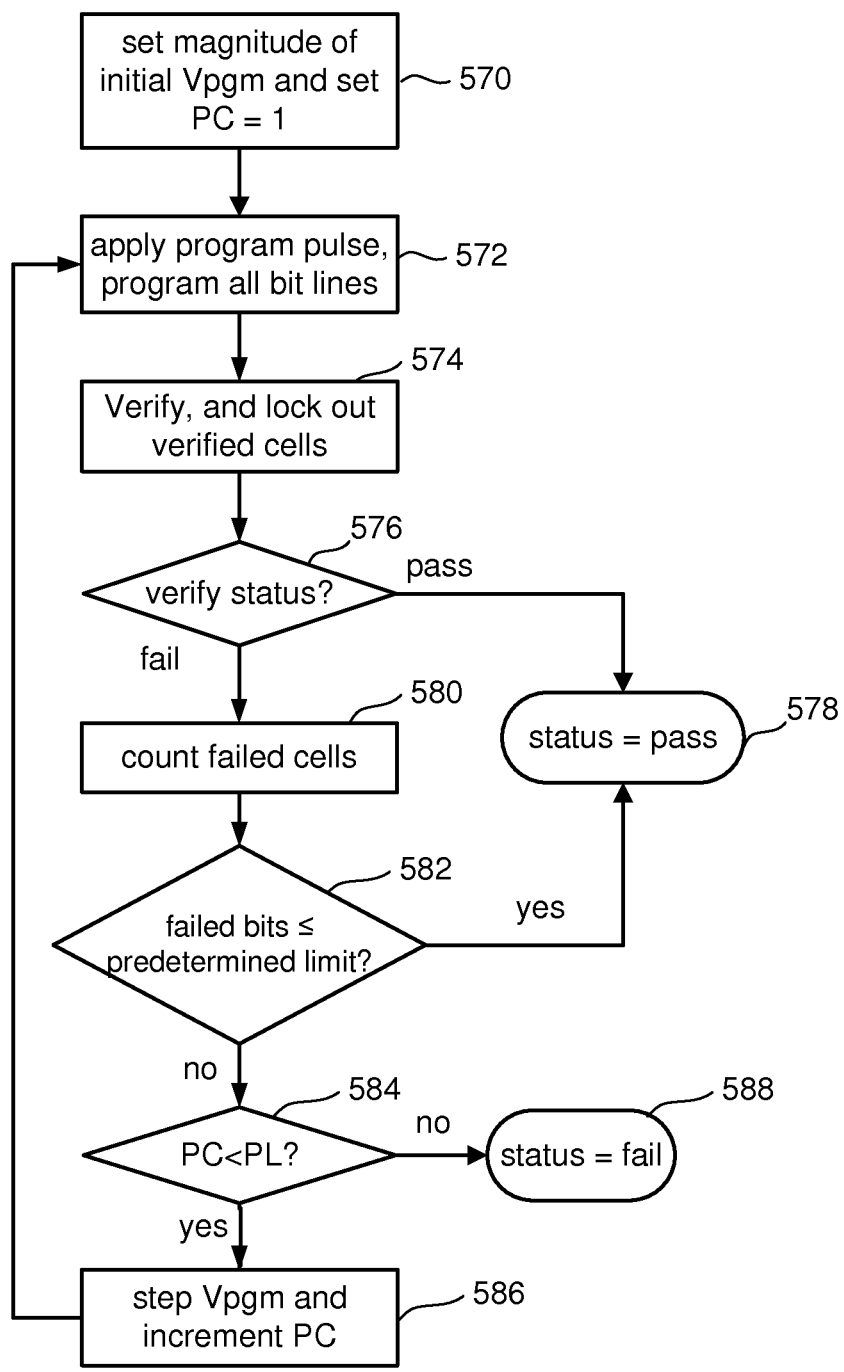
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

When programming data to multiple states (e.g., rather than binary programming), it is important that the programming process be sufficiently precise so that the read process can unambiguously distinguish between the different threshold voltage distributions. For example, the tighter the threshold voltage distribution, the easier it is to unambiguously read the memory cells.

One solution for achieving tight threshold voltage distributions, without unreasonably slowing down the programming process, includes using a two-phase programming process. The first phase, a coarse programming phase, includes an attempt to raise a threshold voltage in a faster manner and paying less attention to achieving a tight threshold voltage distribution. The second phase, a fine programming phase, attempts to raise the threshold voltage in a slower manner in order to reach the target threshold voltage, while also achieving a tighter threshold voltage distribution. One example of a coarse/fine programming methodology can be found in U.S. Pat. No. 6,643,188, incorporated herein by reference in its entirety.

FIGS. 12A, 12B, 13A and 13B provide more details of one example of a coarse/fine programming methodology. FIGS. 12A and 13A depict the threshold voltage of the memory cells being programmed. FIGS. 12B and 13B depict the bit line voltages for the memory cells being programmed. This example of FIGS. 12A, 12B, 13A and 13B uses two verify levels, indicated in the Figures as Vf and Vint. The final target level is Vf. When a threshold voltage of the memory cell has reached Vf, the memory cell will be inhibited from further programming by applying an inhibit voltage to the bit line corresponding to that memory cell. For example, the bit line voltage can be raised to Vinhibit (See FIG. 12B and FIG. 13B). However, when a memory cell has reached a threshold voltage close to (but lower than) the target value Vf, the threshold voltage shift for the memory cell during subsequent programming pulses is slowed down by applying a certain bias voltage to the bit line, typically in the order of 0.3 v to 0.8 v. Because the rate of threshold voltage shift is reduced during the next few programming pulses, the final threshold voltage distribution can be narrower than with other programming methods. To implement this method, a second verify level that is lower than that of Vf is used. This second verify level is depicted in 12A and 13A as Vint, with Vf>Vint. When the threshold voltage of the memory cell is larger than Vint, but still lower than Vf, the threshold voltage shift to the memory cell will be reduced for subsequent programming pulses by applying a bit line bias Vs (FIG. 13B). Note that in this case, two verify operations are required for each state. One verify operation at the corresponding Vf for each state, and one verify operation at the corresponding Vint for each state.

FIGS. 12A and 12B show the behavior of a memory cell whose threshold voltage moves past Vf and Vint in one programming pulse at t2. For example, the threshold voltage is depicted in FIG. 12A to pass Vint and Vf in between t2 and t3. Thus, prior to t3, the memory cell is in the coarse phase. After t3, the memory cell is in the inhibit mode.

FIGS. 13A and 13B depict a memory cell that enters both the coarse and fine programming phases. The threshold voltage of the memory cell crosses Vint in between time t2 and time t3 (e.g., from a programming pulse applies starting at t2). Prior to t3, the memory cell is in the coarse phase. After t3, the bit line voltage is raised to Vs; therefore, the memory cell is in the fine phase. In between t3 and t4, the threshold voltage of the memory cell crosses Vf; therefore, the memory cell is inhibited from further programming by raising the bit line voltage to Vinhibit at t4. If the coarse/fine programming scheme was not being used, the threshold voltage of the memory cells could exceed Vf by a margin much more than depicted in FIG. 13A.

The voltage Vf is greater than the voltage Vint by a difference referred to as A (see FIG. 13A). As taught by FIGS. 12A, 12B, 13A and 13B, in some instances it is desirable to optimize Δ. If Δ is too large, the memory cell spends more time in the fine phases (which is slower than the coarse phase), therefore, the programming process is slower. Additionally, after a few pulses in the fine phase, the memory cell threshold voltage will start to change in a manner more like the coarse phase, which defeats the purpose of the fine phase. If Δ is too small, too many memory cells will pass Vint and Vf in the same pulse (see FIGS. 12A and 12B), thereby eliminating the fine phase and defeating the purpose of coarse/fine programming (e.g., tighter threshold voltage distributions). Either deviation of Δ (too large or too small) can serve to unnecessarily widen the threshold voltage distributions and potentially result in errors during reading. In one example, Δ A is optimized by setting it to be the same as half the step size for successive program pulses (see step 586 of FIG. 11).

One drawback of the immediately above-described coarse/fine programming process is that it requires two consecutive verify operations at two different control gate (Word Line) voltages, for each data state. For example, the wave form of FIG. 9 would include fourteen verify pulses rather than seven. The fourteen verify pulses include two verify pulses (at Vint and Vf) for each data state, where Vf for each data state is the final verify level (Vv1, Vv2, Vv3, Vv4, Vv5, Vv6 and Vv7) and Vint for each data state is at a voltage magnitude less than Vf for each data state by Δ. Having two consecutive verify operations for each data state slows down the program/verify process because the time needed to change the word line voltage is longer than desired. For example, as the word lines become longer to connect with more memory cells, the RC delays increase and slow the down the process of changing the word line voltage. Moreover, slower performance impact due to word line RC delay increase will be greater for more scaled devices.

To address the decrease in speed of the program/verify process because of the time needed to change the word line voltage, a variation of the above-described coarse/fine programming process can be used where the control gate (word line) voltage is the same for both verify operations (verify at Vint and at Vf) for each data state. In this scheme, the sense amplifier will test for two different threshold voltages (e.g., Vint and Vf) by sensing the memory cell for two different currents. This embodiment uses the nature of the CMOS (or other type of) transistor Id–Vg characteristics, in which a higher current will detect a lower threshold voltage and a lower current will detect a higher threshold voltage. For example, FIG. 14 depicts a graph of Icell (current through the memory cell—Id) versus Vcg (the voltage applied to the control gate—Vg) for a memory cell (e.g., transistor). When applying the same voltage at the control gate, testing whether the current through the memory cell is below Iint tests whether the threshold voltage of the memory cell is greater than or equal to Vint and testing whether the current through the memory cell is below If tests whether the threshold voltage of the memory cell is greater than or equal to Vf. Thus, this embodiment (referred to herein as the current sensing verification system) performs the verification by performing two sensing operations, both while the same voltage level is applied to the control gate of the memory cell. During one of the sense operations, the sense amplifier tests whether the current through the memory cell is below Iint. If the current through the memory cell is below Iint, then it is concluded that the threshold voltage is greater than or equal to Vint. During the second of the sense operations, the systems tests whether the current through the memory cell is below If. If the current through the memory cell is below If, then it is concluded that the threshold voltage is greater than or equal to than Vf.

One example implementation of the current sensing verification system charges a capacitor (or, in some embodiments, another type of charge storage device) and then allows the capacitor to discharge through the bit line and NAND string. If the unselected memory cells on the NAND string all receive a large enough control gate voltage to turn them on and act as pass gates, then the charge on the capacitor will effectively be discharged through the selected memory cell to the source line if the voltage applied to the control gate of the selected memory cell was large enough (in comparison to the threshold voltage of the memory cell) to cause the channel of the memory cell to conduct. If the voltage applied to the control gate of the selected memory cell was not large enough (to cause the channel of the memory cell to conduct), the capacitor will not discharge. As the transistors that form the memory cells are not ideal devices, the current will be a function of the control gate voltage, rather than on for control gate voltages above the threshold voltage and off for control gate voltages below the threshold voltage. After a predetermined period of time (known as the strobe time), the voltage across the capacitor can be measured. If the selected memory cell sufficiently conducted current, then a sufficient amount of charge will have dissipated from the capacitor and the voltage would be decreased by at least a predetermined amount. If the selected memory cell did not sufficiently conduct current, then the voltage across the capacitor would not have decreased by the predetermined amount. Therefore, testing the voltage across the capacitor after the strobe time is indication of whether the current was above or below a predetermined current compare level. To test for two current levels (e.g., Icell and Iint), the system can perform two sensing operations using the same control gate voltage and different strobe times. A shorter strobe time is used to test for the higher current (e.g., Iint) corresponding to the lower threshold voltage and the longer strobe time is used to test for the lower current (e.g., If) corresponding to the higher threshold voltage. This verification system for coarse/fine programming saves time by not needing to set up a new control gate voltage between the two sense operations.

In order to increase read performance, a page of memory cells is sensed in parallel. However, operating a large number of memory cells in parallel will also consume a large amount of current. A number of issues arise from operating with large amount of current. Generally, it is always desirable to have a device consuming less power. In particular, components having to accommodate higher current will likely be more bulky and take up valuable chip space. Often, the memory device is designed for the worse-case current while most of the time much less current is operating. This is because the current is dependent on the data programmed into the cells, with the less programmed cells having higher conduction currents.

Another issue has to do with an error introduced by a finite resistance between the source line and the ground pad of the chip. One potential problem with sensing memory cells is source line bias caused by source loading across the finite resistance. When a large number of memory cells are sensed in parallel, their combined currents can result in significant voltage drop in a ground loop with finite resistance. This results in a source line bias which causes error in a read operation employing threshold voltage sensing.

A related problem pertains to the finite resistance of the bit line between the drain of a memory cell being sensed and the sensing circuit corresponding to the memory cell being sensed. Bit line resistance becomes more significant as the sizes of semiconductor devices and circuits shrink with new technology developments. The bit line resistance and current in turn affect the voltage at the drain of the memory cell being sensed. Since sensing of memory cells is often done at the sub-threshold (that is, below the threshold voltage) region of memory cells, variation in drain voltage can exacerbate non-idealities present in the drain current/gate-to-source voltage behavior of modern memory cells.

Described herein is a technology whereby the system may compensate for changes in bit line resistance that depend on the distance from a given word line, and the memory cells connected to this word line, to the sensing circuit used to detect the current flowing through the bit line. The variation in bit line resistance, for which the system may compensate, may result in an error for a read or verify operation on a selected memory cell connected to the bit line. One way to ensure that a memory cell is read correctly, regardless of its position on the bit line, is to ensure that the amount of charge stored onto or depleted from the charge storage device of the corresponding sensing circuit is kept constant. The amount of charge thus moved to or from the charge storage device of the sensing circuit may be described by the following charge conservation equation: $I*t=C*V$. Each side of the equation is expressed in units of charge, and represents the quantity of charge removed from the charge storage device while the memory cell is being sensed. On the left side of the equation, "I" represents the bit line current induced by the read or verify voltage applied to the control gate of the memory cell, which triggers the flow of current if this input voltage exceeds the threshold voltage of the memory cell. Also on the left side of the equation, "t" represents the amount of time allotted for the sense operation, also known as the strobe time. This is also the time during which the charge storage device dissipates its charge through the bit line and the memory cell being sensed. On the right side of the equation, "C" represents the capacitance, or equivalent quantity, of the charge storage device of the sensing circuit, whereas "V" represents the change in voltage across this charge storage device. The bit line current is largely determined by the read or verify voltage, and also to a substantial degree by the drain voltage of the memory cell being sensed. Thus, embodiments of the disclosed technology may modulate the 't' or 'V' variables, namely, the strobe time allotted for the sense operation or the change in voltage on the charge storage device needed for the system to distinguish between data states. For example, if the current conducted by memory cell A while sensing memory cell A will be higher than the current conducted by memory cell B while sensing memory cell B, then, by the equation presented above, the change in voltage on the charge storage device of memory cell A must be greater during the strobe time common to both memory cells A and B, and if the final voltage values on the charge storage devices must be the same, then the charge storage device of memory cell A must be pre-charged to a higher voltage than that of memory cell B. Alternatively, the strobe time for sensing memory cell A must be shorter than the strobe time for sensing B, holding constant for both memory cells the voltage change, and therefore, the pre-charge voltage. However, in some embodiments, the system may modulate both 't' and 'V' variables in order to finely control the system response to the variation in bit line resistance, or to balance tradeoffs between speed and power related to the choice of modulating versus modulating 'V'.

Figure 15:
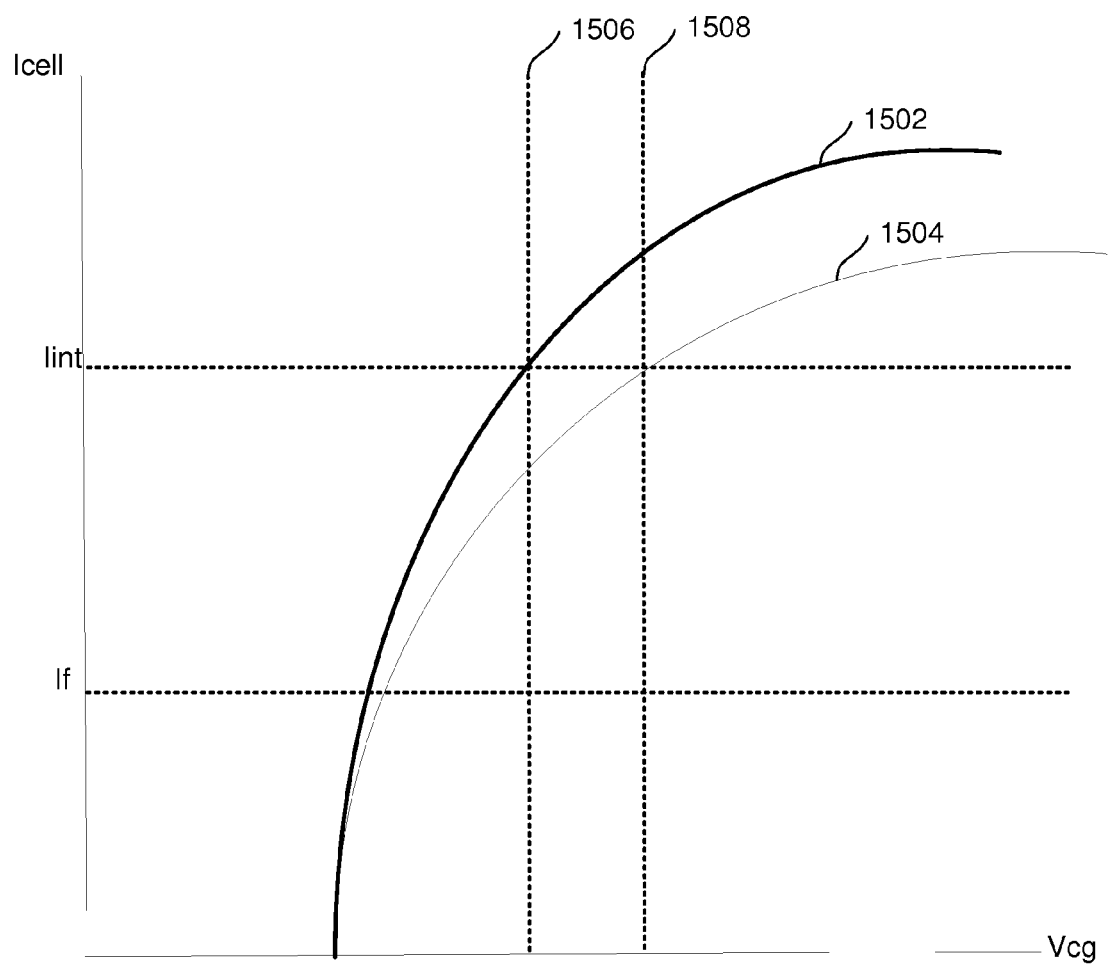
FIG. 15 is a graph of memory cell current versus control gate voltage for two memory cells that differ in distance from their respective sensing circuits.

FIG. 15 depicts the function of FIG. 14 for two different memory cells. These memory cells differ because of their positions with respect to their respective sensing circuits. Curve 1502 is the Icell–Vcg function of a memory cell that is relatively close to its sensing circuit. Curve 1504 is the Icell–

Vcg function of a memory cell that is relatively far from its sensing circuit. While both curves have approximately the same shape, curve 1504 has a more gradual slope. This difference arises due to the fact that the resistance on the bit line from the drain of the transistor to the sensing circuit is greater for the memory cell represented by curve 1504 than the corresponding quantity is for the memory cell represented by curve 1502. This greater resistance is due to the further distance of the memory cell represented by curve 1504, and, consequently, the longer length of bit line. More detail will be provided in FIG. 18. To draw the same current during a sensing operation, the drain voltage of the memory cell represented by curve will have to be larger than if it were closer to the sensing circuit. However, due to drain induced barrier lowering (the "DIBL" effect), a larger Vcg is needed to obtain the same current in order to compensate for the higher drain voltage. Hence, for the same current, curves 1502 and 1504 show two different corresponding Vcg values. This difference is especially pronounced at Iint, as shown by the lines 1506 and 1508. Thus, when sensing the memory cells represented by curves 1502 and 1504, the system will likely require some way to compensate for the different in Icell for the same Vcg. One way to do this while maintaining the same Vcg for different word lines is to modulate the current Icell according to the positions of the memory cell being sensed with respect to its sensing circuit. More detail will be provided below.

Figure 16:
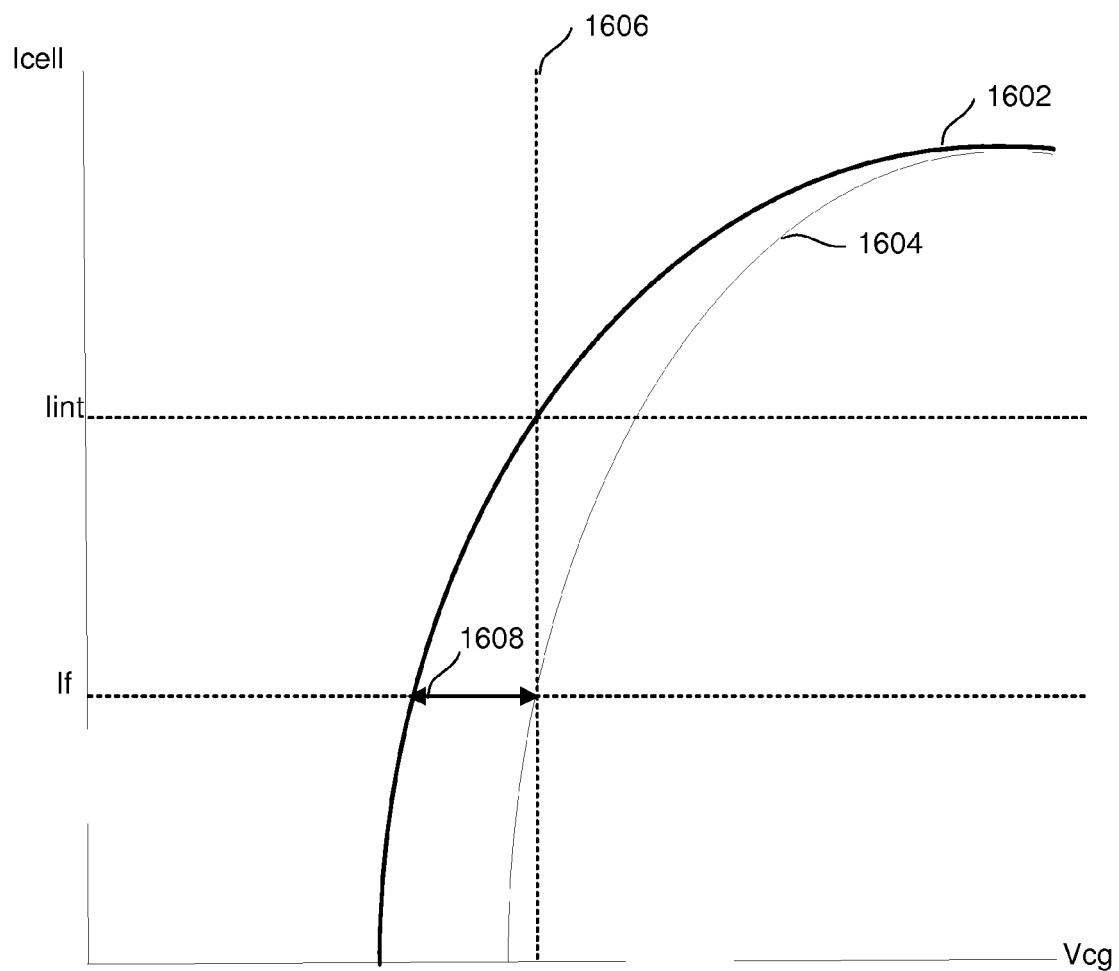
FIG. 16 is a graph of memory cell current versus control gate voltage for two memory cells that differ in threshold voltage.

FIG. 16 is a graph illustrating the differences in Icell–Vcg functions (see FIG. 14) between two memory cells. Unlike the memory cells represented in FIG. 15, the memory cells represented by curves 1602 and 1604 are both relatively close to their respective sensing circuits, and therefore, these memory cells see no significant difference in resistance from their drains to their respective sensing circuits through the bit lines. However, as FIG. 16 shows, these memory cells still differ in Icell–Vcg functions. This difference arises due to difference in threshold voltage between the memory cells. Line 1606 demonstrates how for the same Vcg, each memory cell meets one of If or Iint. This allows the system to avoid having to change Vcg for each memory cell. Bidirectional arrow 1608 represents the voltage difference (referred to above as A) between the verify voltages Vint and Vf that correspond to Iint and If, as discussed above.

Figure 17A:
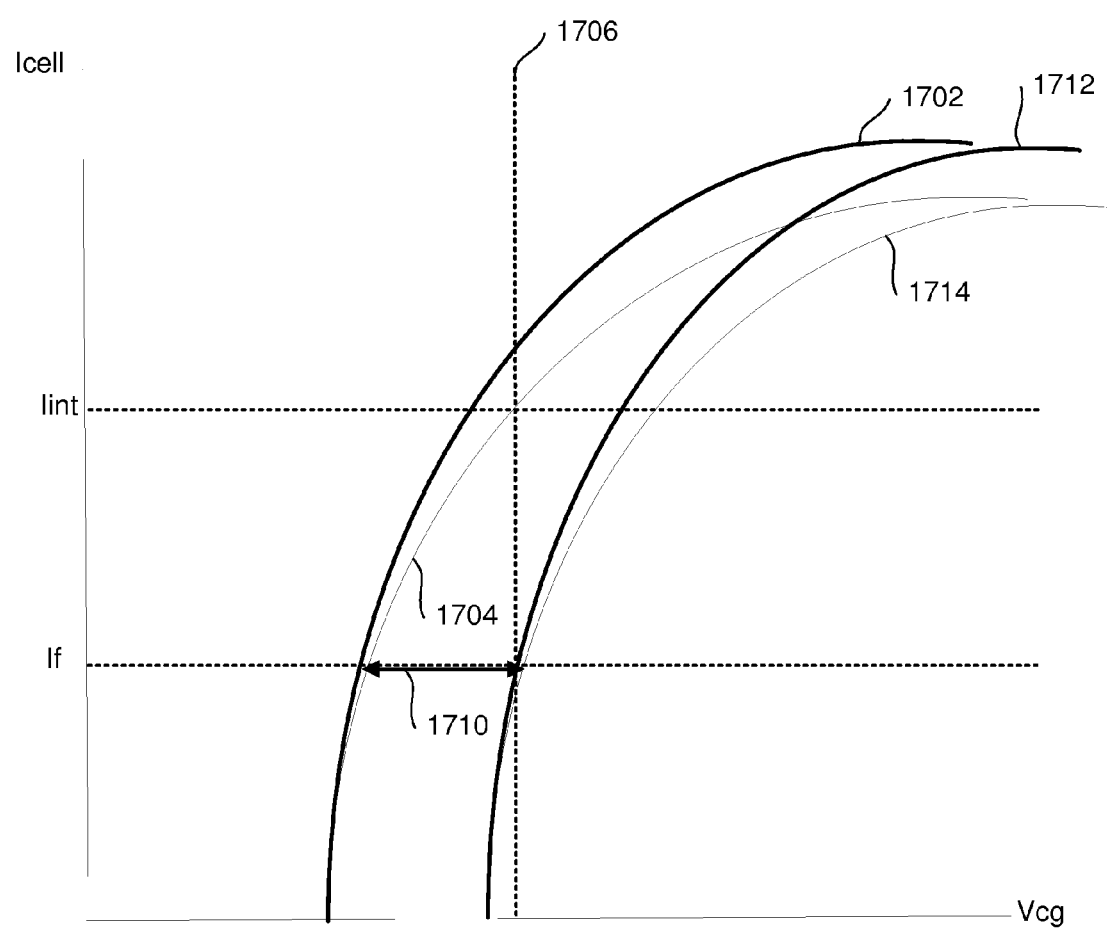
FIGS. 17A-17B are graphs of memory cell current versus control gate voltage for four memory cells that differ in distance from their respective sensing circuits as well as threshold voltage.
Figure 17B:
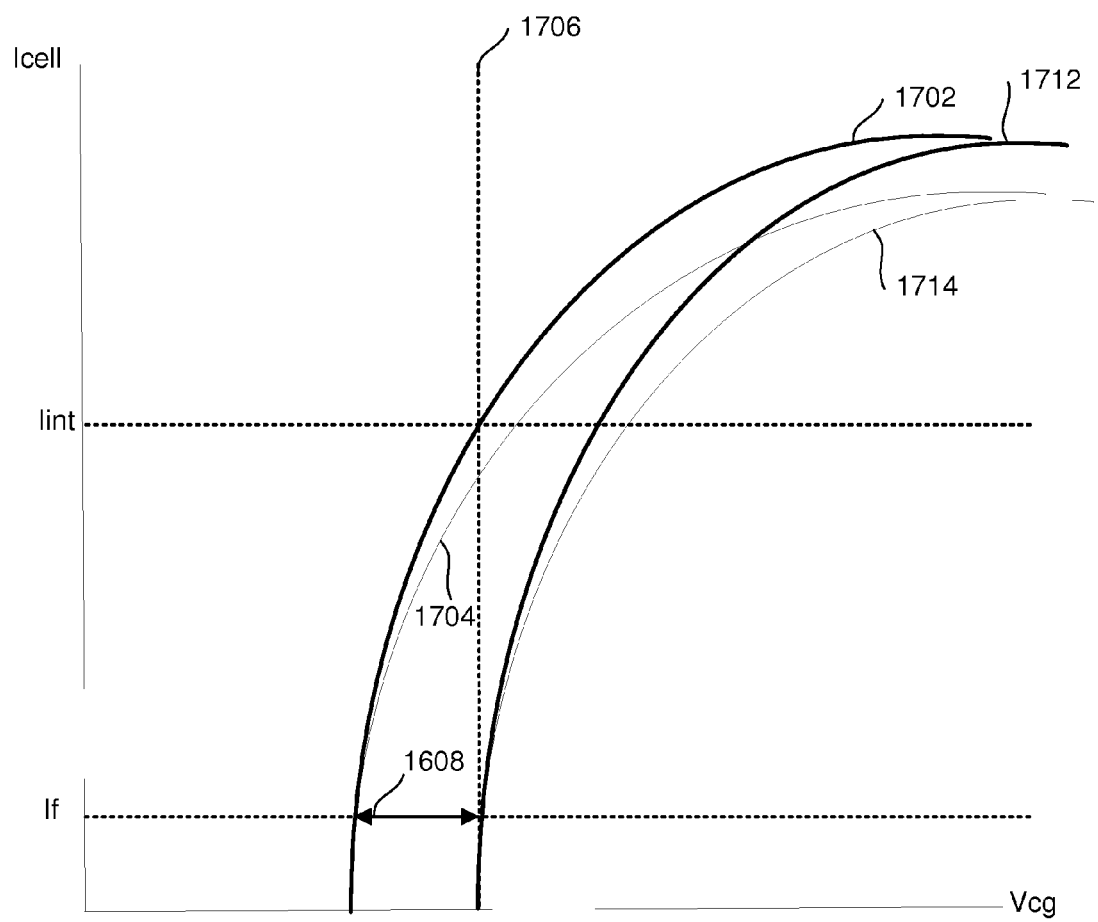

FIG. 17A is a graph illustrating the differences in Icell–Vcg functions (FIG. 14) among four different memory cells. The memory cells represented by curves 1702 and 1712 are close to their respective sensing circuits, but differ by threshold voltage, whereas the memory cells represented by curves 1704 and 1714 are far from their respective sensing circuits but differ by threshold voltage (as shown by FIG. 16). The difference in Icell–Vcg between the pairs of memory cells represented by 1702/1704 and 1712/1714 is similar to the difference between curves 1502 and 1504 in FIG. 15. The line 1706 represents the voltage at which the currents through all memory cells exceed Iint or If. The differences in Icell–Vcg functions among the memory cells represented cause a change in the difference between Vint and Vf (Δ), as shown by comparing the length of bidirectional arrow 1710 with that of bidirectional arrow 1608 from FIG. 16. As explained above, it is often desirable to optimize Δ so that it is not too small and not too large. If Δ sufficiently changes with distance from sensing circuit, it will be difficult to optimize Δ and the threshold voltage distributions of the programmed memory cells may not be as narrow as desired to avoid errors during reading. To avoid this issue, the verify operation can be adjusted based position of the memory cell with respect to its sensing circuit, so that Δ is constant over the position of the memory cell being sensed with respect to its sensing circuit, including that Δ is constant over time. Having a constant Δ will result in narrower threshold voltage distributions for the programmed memory cells, which will help avoid errors during reading. In order to maintain the same Δ between Vint and Vf, the values for Iint and If can be changed for memory cells that are more distant from their respective sensing circuits. This change is shown in FIG. 17B, which is the same as FIG. 17A, except that bidirectional arrow 1710 is replaced by bidirectional arrow 1608 from FIG. 16, and Iint, If and line 1706 are adjusted so that the memory cells are considered conducting (or that control gate voltage has exceeded threshold voltage) for the same Vint and Vf. In some embodiments, If is not adjusted since memory cells of different distance from their respective sensing circuits may have very similar Icell values for low Vcg. In other embodiments, If is adjusted and Iint is maintained. In order to maintain the same Δ across memory cells, regardless of their position, the system can change the current Icell at which the sensing circuit considers a memory cell conducting according to the position of the memory cell being sensed. One means for adjusting the current level sensed for is to adjust the strobe time (discussed above). In an embodiment that tests the current through the memory cell by monitoring the change in voltage of a capacitor being discharged through the selected memory cell, another means for adjusting the current level sensed for is to adjust the voltage level compared against the voltage of the capacitor. In an embodiment that test the current through the memory cell by monitoring the change in voltage of a capacitor being discharged through the selected memory cell, another means for adjusting the current level sensed for is to adjust the initial voltage level of the capacitor (also called the pre-charge level) before discharging the capacitor. Another means for adjusting the current level sensed for is to adjust current level used to compare against the memory cell current. Other sensing parameters, in addition to the ones discussed above, can also be adjusted.

Figure 18:
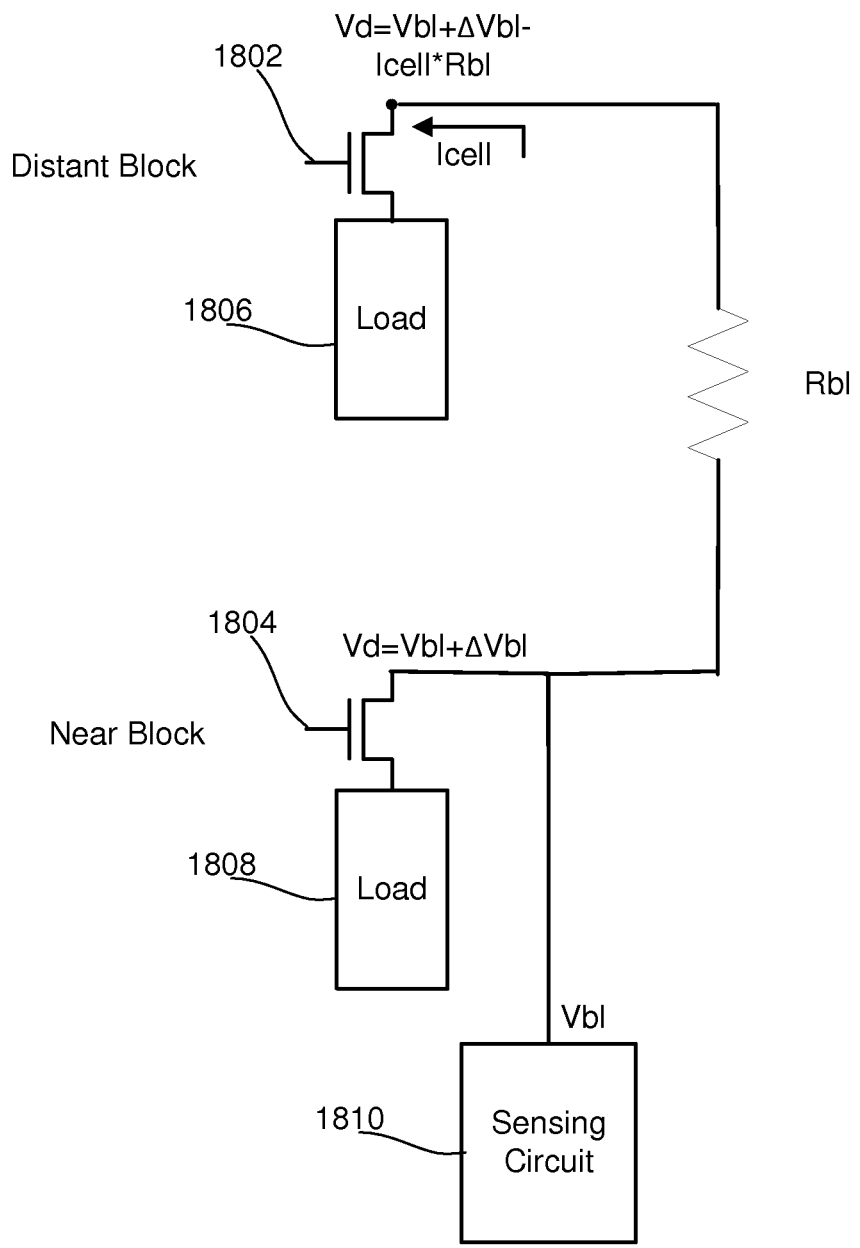
FIG. 18 is a circuit schematic illustrating the difference between the drain voltage of a memory cell near its sensing circuit and the drain voltage of a memory cell far from its sensing circuit.

FIG. 18 is a circuit schematic illustrating the difference between the drain voltage of a memory cell near its sensing circuit and the drain voltage of a memory cell far from its sensing circuit. FIG. 18 shows two memory cells, memory cell 1802 which is located in a block far from Sensing Circuit 1810, and memory cell 1804 which is located near Sensing Circuit 1810. In one embodiment, Sensing Circuit 1810 is all or part of Sense Module 480 (see FIG. 4). Each memory cell has its drain attached to a common bit line and its source connected to its own load (1806 and 1808, respectively). The bit line continues to common Sensing Circuit 1810. The voltage at the node at which the bit line connects with Sensing Circuit 1810 is Vb1. The voltage at the drain of memory cell 1804 is Vb1+ΔVb1 (not to be confused with 'Δ' above), which is negligibly greater than Vb1. However, resistor Rb1 represents the difference in resistance seen by distant memory cell 1802 as opposed to that seen by nearby memory cell 1804. Thus, as a result of the difference in resistance seen by the memory cells, when distant memory cell 1802 is conducting, the current Icell that distant memory cell 1802 draws passes through Rb1. Since Icell flows into the drain of the transistor, the voltage at the drain of memory cell 1802 is the voltage at the drain of memory cell 1804 less the product of Icell and Rb1, or Vb1+ΔVb1−Icell*Rb1. Due to physical effects such as DIBL, this significant difference in rain voltage between the two memory cells leads to the difference in the Icell–Vcg function shown by FIG. 15.

Figure 19A:
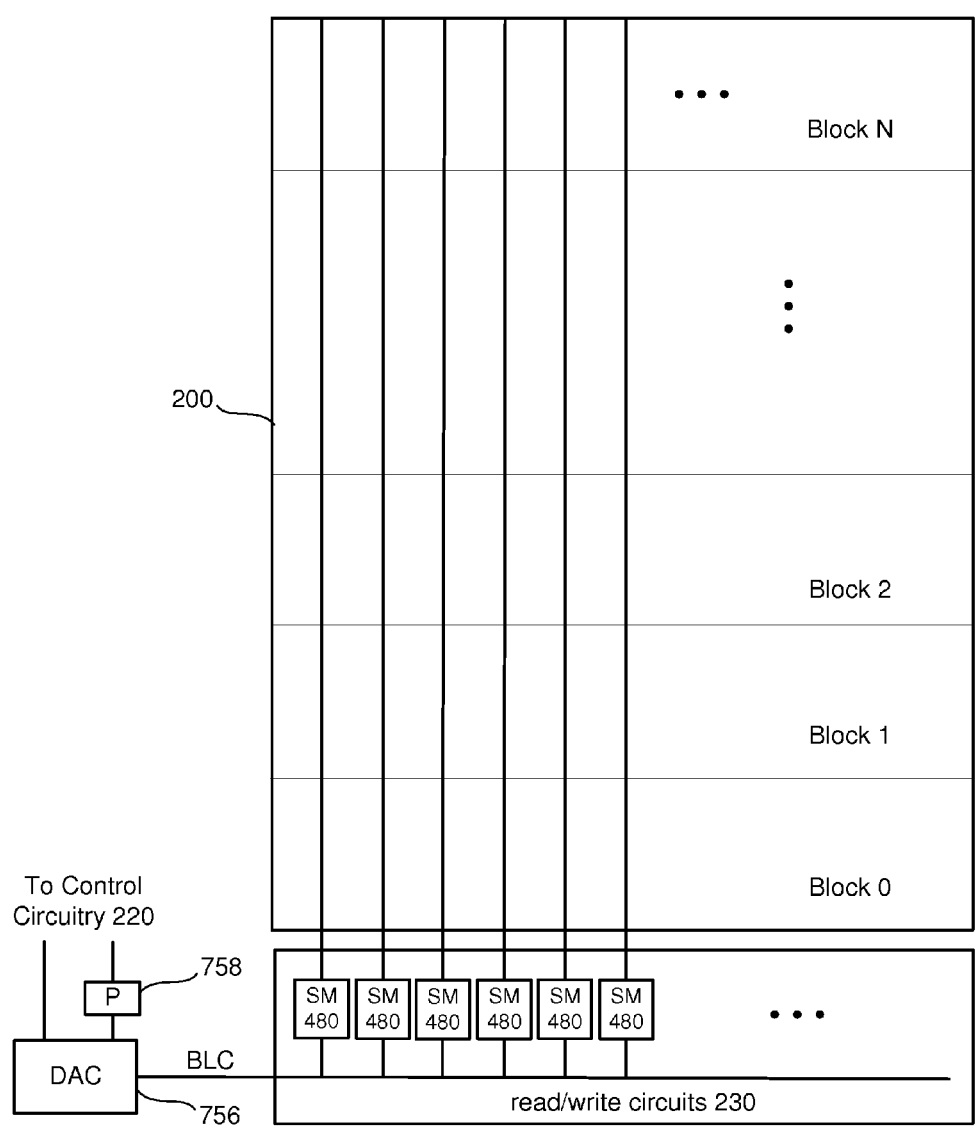

FIG. 19A shows read/write circuits 230 connecting to bit lines from one side of the array 200. FIG. 19A shows how the example of FIG. 18 can fit into the general architecture of a memory chip. In one example arrangement depicted in FIG.

19A, all bit lines are connected to Sense Modules 480 on the bottom of the array (in read/write circuits 230). Other arrangements can also be used; for example, all bit lines can be connected to sense modules that are placed in read/write circuits on the top of the array.

One issue with the arrangement of FIG. 19A is that the line length of the bit line from the Sense Module to the word line selected for sensing (and, therefore, to the memory cells selected for sensing) varies based on the position of the memory cells selected for reading in the memory array 200. Because different memory cells will have different bit line lengths to the Sense Module and the bit lines resistance is based on length of the bit line, the memory cells may experience different voltage drops due to different bit line resistances. This phenomenon has also been described above in FIG. 18.

In order to read data from a memory cell, a charge storage device (located in Sense Circuitry 470 of Sense Modules 480) in communication with the bit line is pre-charged to a voltage appropriate for reading the memory cell. If the Sense Module is far from the memory cell, then as FIGS. 15-18 show, the pre-charge voltage has to be decreased so that the lower current through the memory cell will reduce the voltage on the charge storage device to a given final value for a given strobe time. Alternatively, the strobe time can be increased so that the lower current through the memory cell will reduce the voltage on the charge storage device to the same final value for a given pre-charge voltage.

If a word line selected for reading is close to the bottom of the array 200, then as FIGS. 15-18 show, the pre-charge voltage has to be increased so that the higher current through the memory cell will reduce the voltage on the charge storage device to a given final value for a given strobe time. Alternatively, the strobe time can be decreased so that the higher current through the memory cell will reduce the voltage on the charge storage device to a given final value for a given pre-charge voltage. If all Sense Modules 480 are tuned to provide the same pre-charge voltage, then when some memory cells (typically, those further from Sense Modules 480) are selected for sensing, Sense Modules 480 in Read/Write Circuits 230 at the bottom of the array 200 to apply a larger voltage than necessary. As discussed above, it is desirable to reduce bit line voltages. Therefore, one embodiment of the disclosed technology will have the Sense Modules 480 concurrently pre-charge their charge storage devices to different voltages on the respective bit lines based on how far the selected word line (and, therefore, the selected memory cells) is from the respective Sense Modules. Another embodiment does not vary the pre-charge voltage to which the charge storage device is charged, but changes the strobe time based on how far the selected word line (and, therefore, the selected memory cells) is from the respective Sense Modules so that the same final voltage on the charge storage device is reached regardless of the current drawn by the selected memory cell.

In one embodiment, Control Circuitry 220 can calculate how far the selected word line is from Read/Write Circuits 230, and set parameter 758 accordingly. One alternative is for Control Circuitry 220 to have a table that associates parameter values (such as pre-charge voltage or strobe time) with word line location so that the Control Circuitry 220 need not waste time calculating distance.

In another embodiment, memory array 200 can be broken into zones. In one implementation, each zone includes one or more blocks. For example, an array of 2000 blocks can be grouped into ten zones of two hundred blocks each. Other groupings can also be used. Each zone can be associated with a parameter that specifies the pre-charge voltages for charge storage devices (and/or strobe time) in communication with bit lines connected to Read/Write Circuit 230 and/or a parameter that specifies the bit line voltages for bit lines connected to Read/Write Circuits 230. In one embodiment, Control Circuitry 220 stores a table of parameter values for each zone. Therefore, knowing location of the word line or memory cell allows for a determination of the appropriate pre-charge voltage for the respective charge storage device. Other methods for calculating the parameters can also be used. For example, the appropriate parameter can be chosen based on zone, block or word line position, as well as other distance based data/metrics.

FIG. 19B shows read/write circuits 230A connecting to bit lines from the bottom of the array 200 and read/write circuits 230B connecting to bit lines from the top of the array 200. FIG. 19B shows how the example of FIG. 18 can fit into the general architecture of a memory chip, as one possible alternative to FIG. 19A. In one example arrangement depicted in FIG. 19B, two consecutive bit lines are connected to Sense Modules 480 on the bottom of the array (in read/write circuits 230A), the next two consecutive bit lines are connected to Sense Modules 480 on the top of the array (in read/write circuits 230B), the next two consecutive bit lines are connected to Sense Modules 480 on the bottom of the array (in read/write circuits 230A), the next two consecutive bit lines are connected to Sense Modules 480 on the top of the array (in read/write circuits 230B), and so on. Other arrangements can also be used, for example, eight (or another number) consecutive bit lines can be grouped on top/bottom.

One issue with having some of the Sense Modules on top of the array and other Sense Modules on the bottom of the array is that the line length of the bit line from the Sense Module to the word line selected for sensing (and, therefore, to the memory cells selected for sensing) is different based on whether the Sense Modules are on the top or bottom. Because different memory cells will have different bit line lengths to the Sense Module and the bit lines resistance is based on length of the bit line, the memory cells may experience different voltage drops due to different bit line resistances.

In order to read data from a memory cell, a charge storage device (located in Sense Circuitry 470 of Sense Modules 480) in communication with the bit line is pre-charged to a voltage appropriate for reading the memory cell. If the Sense Module is far from the memory cell, then as FIGS. 15-18 show, the pre-charge voltage has to be decreased so that the lower current through the memory cell will reduce the voltage on the charge storage device to a given final value for a given strobe time. Alternatively, the strobe time can be increased so that the lower current through the memory cell will reduce the voltage on the charge storage device to the same final value for a given pre-charge voltage.

If a word line selected for reading is close to the bottom of the array 200, then as FIGS. 15-18 show, the pre-charge voltage has to be increased so that the higher current through the memory cell will reduce the voltage on the charge storage device to a given final value for a given strobe time. Alternatively, the strobe time can be decreased so that the higher current through the memory cell will reduce the voltage on the charge storage device to a given final value for a given pre-charge voltage. If all Sense Modules 480 are tuned to provide the same pre-charge voltage, then that pre-charge voltage must be large enough to account for the larger voltage drop of the memory cells (as shown in FIG. 18) connected to Sense Modules 480 in Read/Write Circuits 230B at the top of the array 200. This condition causes Sense Modules 480 in Read/Write Circuits 230A at the bottom of the array 200 to apply a larger voltage than necessary. As discussed above, it is desirable to reduce bit line voltages. Therefore, one embodiment of the disclosed technology will have the Sense Modules 480 concurrently pre-charge their charge storage devices to different voltages on the respective bit lines based on how far the selected word line (and, therefore, the selected memory cells) is from the respective Sense Modules. Another embodiment does not vary the pre-charge voltage to which the charge storage device is charged, but changes the strobe time based on how far the selected word line (and, therefore, the selected memory cells) is from the respective Sense Modules so that the same final voltage on the charge storage device is reached regardless of the current drawn by the selected memory cell.

In one alternative, both DAC 750 and DAC 760 can read the same parameter and determine their output voltages based on that one parameter. For example, the parameter may indicate which DAC should produce the higher (or lower) voltage output.

In one embodiment, Control Circuitry 220 can calculate how far the selected word line is from Read/Write Circuits 230A and Read/Write Circuits 230B, and set parameters 752 and 762 accordingly. One alternative is for Control Circuitry 220 to have a table that associates parameter values (such as pre-charge voltage or strobe time) with word line location so that the Control Circuitry 220 need not waste time calculating distance.

In another embodiment, memory array 200 can be broken into zones. In one implementation, each zone includes one or more blocks. For example, an array of 2000 blocks can be grouped into ten zones of two hundred blocks each. Other groupings can also be used. Each zone can be associated with a parameter that specifies the pre-charge voltages for charge storage devices (and/or strobe time) in communication with bit lines connected to Read/Write Circuits 230A/230B and/or a parameter that specifies the bit line voltages for bit lines connected to Read/Write Circuits 230A/230B. In one embodiment, Control Circuitry 220 stores a table of parameter values for each zone. Therefore, knowing location of the word line or memory cell allows for a determination of the appropriate pre-charge voltage for the respective charge storage device. Other methods for calculating the parameters can also be used. For example, the appropriate parameter can be chosen based on zone, block or word line position, as well as other distance based data/metrics.

In memory arrays that connect eight consecutive bit lines to the Sense Modules at the top of the array, connect the next eight consecutive bit lines to the Sense Modules at the bottom of the array, and so on, it may be desirable to provide a particular bit line voltage for bit lines who have both neighbors connected to the same side of the array and provide a different bit line voltage to bit lines who have neighbors connected to different sides of the array (border bit lines). Each side of the array would have two DACs to provide the different voltages. This arrangement is done to compensate for bit line to bit line capacitive coupling that will affect the voltage of the border bit lines. Bit lines that have neighbors connected to different sides of the array need a higher bit line voltage to compensate for the bit line to bit line capacitive coupling. Having large groups of consecutive bit lines connected to the same side reduces the number of bit lines that have neighbors connected to different sides of the array, thereby allowing for more bit lines with lower voltages. In some alternatives, Sense Module may be placed in more than two locations, therefore requiring more than two bit line voltages to be applied. However, in some embodiments, the system waits long enough for the bit line to charge up that the RC delay associated with parasitic capacitances (in particular, the capacitive coupling between neighboring bit lines) is negligible, and thus the final bit line voltage need only depend on parameters such as bit line resistance.

Figure 20:
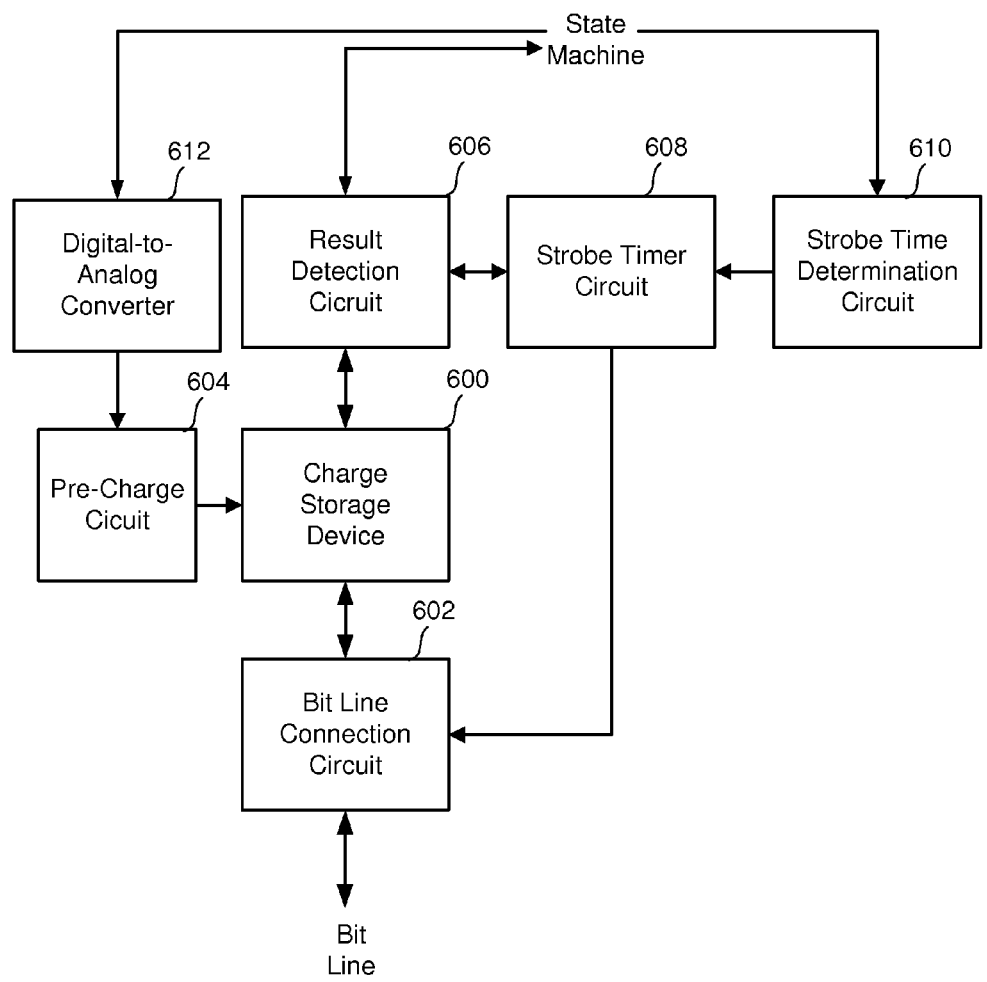
FIG. 20 is a block diagram depicting one embodiment of components in sense circuitry.

FIG. 20 is a block diagram depicting one example of a subset of components in sense circuitry 470 (see FIG. 4), which in turn is contained in Sense Module 480 (see FIG. 19) for the embodiment in which the testing whether the non-volatile storage element has at least a particular threshold voltage during a verify operation includes adjusting the current level being sensed.

FIG. 20 shows charge storage device 600 (which can be a capacitor or other type of storage device) in communication with a Bit line Connection Circuit 602, Pre-charge Circuit 604 and Result Detection Circuit 606. Bit line Connection circuit is in communication with the bit line. Result Detection Circuit 606 is in communication with the State Machine (discussed above) and Strobe Timer Circuit 608. In one embodiment, Strobe Time Determination Circuit 610 receives an input from the State Machine. The output of strobe time determination circuit 610 is provided to strobe timer circuit 608. Based on whether the sense circuitry is testing whether nonvolatile storage element has at least a threshold voltage of Vread, Vf, or Vint, and the position of the currently sensed memory cells with respect to the sensing circuit, Strobe Time Determination circuit 610 will determine the strobe time for allowing the charge storage device 600 to dissipate its charge through the bit line and selected memory cell. That determined strobe time is provided to Strobe Timer circuit 608 which will keep track of the time elapsed while discharging charge storage device 600 and indicates to Result Detection circuit 606 when the strobe time has elapsed. In some embodiments, Strobe Time Determination Circuit 610 is omitted, and the strobe time is predetermined.

Bit Line Connection circuit 602 is used to connect charge storage device 600 to the bit line and disconnect charge storage device 600 from the bit line. Pre-charge Circuit 604 is used to pre-charge the charge storage device 600 to a pre-determined voltage. As described below, it is sometimes necessary to adjust the pre-determined voltage to which charge storage device 600 is charged. In one embodiment, the state machine is able to communicate with pre-charge circuit 604, such that the state machine may control the voltage to which pre-charge circuit 604 sets charge storage device 600. One way the state machine may control the pre-charge voltage of charge storage device 600 is to send pre-charge circuit 604 a digital signal, which pre-charge circuit may then convert into an analog voltage value by means of Digital-to-Analog converter (DAC) 612. Some embodiments omit Digital-to-Analog converter 612. After pre-charging charge storage device 600, Bit line Connection Circuit 602 will connect charge storage device 600 to the bit line and allow the charge storage device to dissipate its charge through the bit line and the selected memory cell. After the strobe time has elapsed, Strobe Timer circuit 608 will alert Result Detection circuit 606 that the strobe time has elapsed and Result Detection circuit 606 will sense whether a pre-determined current flowed through the selected memory cell in response to discharging the storage device 600. In one embodiment, Result Detection circuit 606 will test the voltage of charge storage device 600 at the end of the strobe time and compare it to the pre-charge voltage. The change in voltage of the charge storage device 600 can be used to calculate information about the current conducted by the memory cell being sensed. If the change in voltage is greater than a particular pre-determined value, then it is concluded that the current through the memory cell was greater than the current being sensed for.

Figure 20A:
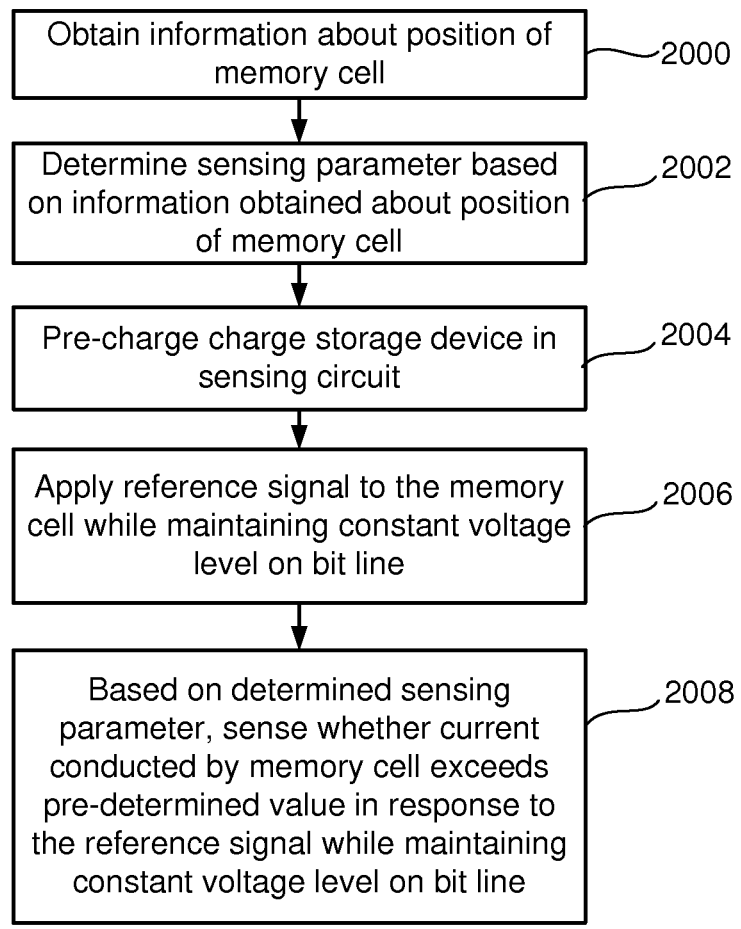
FIG. 20A is a flow chart depicting one embodiment of a process for sensing a non-volatile storage element.

FIG. 20A is a flow chart depicting one embodiment of a process for sensing a non-volatile storage element. The process of FIG. 20A can be performed during a verify or read operation, and is thus one example implementation of step 574 of FIG. 11 or step 526 of FIG. 6. In step 2000 of FIG. 20A, the system obtains information about the position of the memory cell being sensed. In one embodiment, this information is about the position of the memory cell being sensed with respect to its respective sensing circuit (e.g., distance from the memory cell to the sense amplifier). In one embodiment, the information about the position of the memory cell being sensed includes or can be based on (wholly or in part) the block address of the non-volatile storage element being sensed. In a further embodiment, the information about the position of the memory cell being sensed includes or is based on the address of the word line (in addition to or instead of the block address) connected to the memory cell being sensed. Once the system has obtained information about the position of the memory cell being sensed, in step 2002, the system uses this information to determine one or more sensing parameters according to which the sensing operation will proceed. In one embodiment, this sensing parameter is duration of time for which the memory cell will be sensed (ie strobe time). In another embodiment, this sensing parameter is the voltage to which a charge storage device in the sensing circuit will be pre-charged. In some embodiments, information in addition to that pertaining to the position of the memory cell being sensed can be used to determine the sensing parameters.

In step 2004, the system pre-charges a charge storage device in the sensing circuit. In one embodiment, this charge storage device includes one or more capacitors. In one embodiment, the voltage to which the charge storage device is charged is predetermined. In another embodiment, the voltage to which the charge storage device is charged is determined by the system in step 2002, as explained above. In step 2006, the system applies a reference signal to the memory cell being sensed while maintaining a constant voltage level on the bit line to which the memory cell being sensed is connected. In one embodiment, this reference signal is a voltage applied to the control gate of a NAND flash memory cell. In further embodiments, this voltage (with reference to FIG. 8) can take the values Vr1-Vr7 during read operations or Vv1-Vv7 during verify operations when the system is sensing the respective data state for those voltage values. Typically, if the voltage applied to the control gate is greater than the threshold voltage of the memory cell, then current will flow through the channel of the memory cell and the bit line to which it is connected, thereby depleting charge from the charge storage device pre-charged in step 2004. After applying the reference signal to the memory cell, the system waits for a certain duration of time before proceeding. In one embodiment, this duration of time predetermined. In another embodiment, this duration of time is determined by the system in step 2002, as explained above. In step 2008, the system senses whether the current conducted by the memory cell in response to the application of the reference signal to the memory cell for the duration of time described above exceeds a pre-determined value. In one embodiment, sensing the current conducted by the memory cell for a given duration of time (strobe time) comprises sensing the change in the voltage of the charge storage device pre-charged in step 2004. More detail will be provided below.

Figure 21:
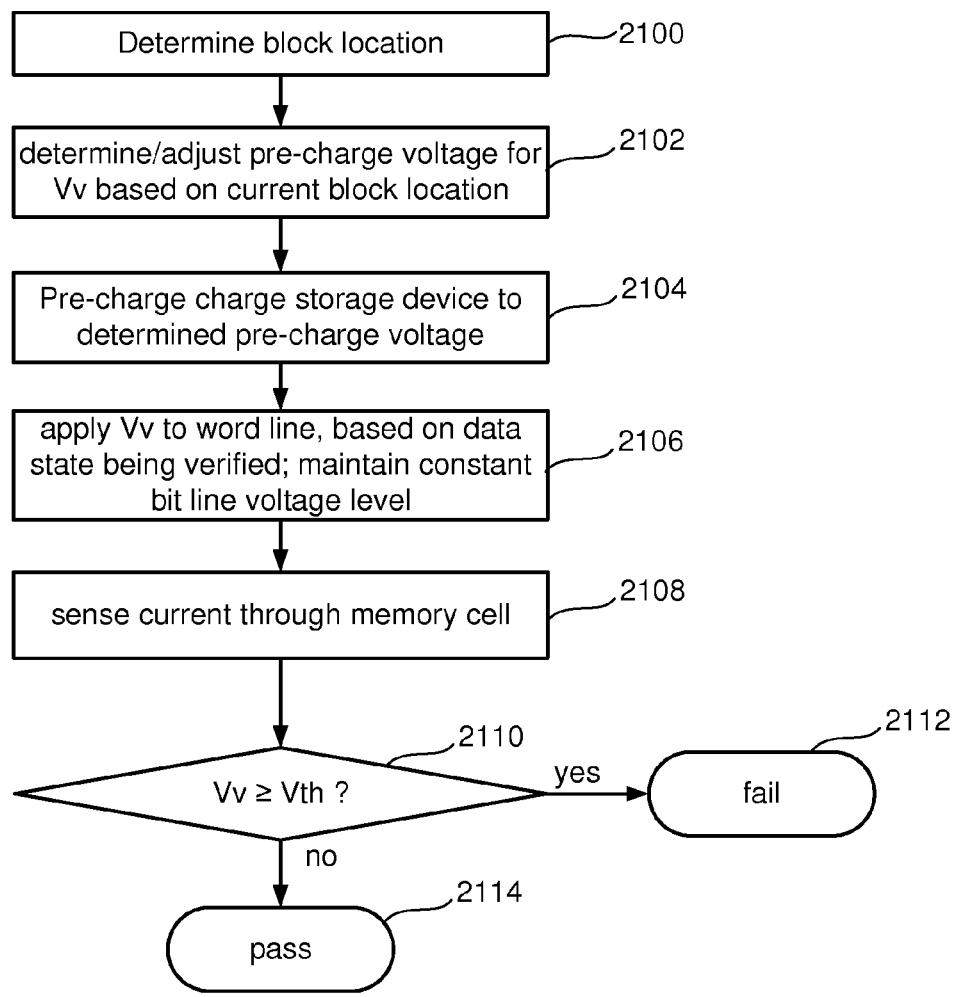
FIG. 21 is a flow chart depicting one embodiment of a verify process.

FIG. 21 is a flow chart depicting one embodiment of a process for performing verification during a programming process. The method depicted in FIG. 21 is one example implementation of the method of FIG. 20A or of steps 574 and 576 of FIG. 11. In step 2100 of FIG. 21, the system determines the position of the memory cell whose programming is being verified. In one embodiment, with reference to FIG. 19, the system determines, with relation to sensing circuit 470, the location of the block of the memory cell which is being verified. In another embodiment, the system determines the position of the word line which is connected to the memory cell which is being verified. In step 2102, the system uses the information obtained in step 2100 to determine the voltage to which a charge storage device in the sensing circuit is pre-charged. In one embodiment, this pre-charge voltage depends both on the position of the memory cell which is being verified, as well as the data state for which the memory cell is being verified. For example, in some cases, for a given memory cell, the current through the memory cell when Vv1 (referring to FIG. 8) is applied to the control gate may differ significantly enough from the current through the memory cell when one or more of Vv2-Vv7 are applied to the memory cell that the voltage to which the charge storage device in the sensing circuit is pre-charged may have to vary accordingly. In step 2104, the system pre-charges the charge storage device in the sensing circuit to the voltage determined in step 2102.

In step 2106, for the data state being verified, the system applies the appropriate verify voltage to the word line to which the memory cell is connected, maintaining the voltage level of the bit line to which the memory cell is connected at a constant value. For example (referring to FIG. 8), if the system is verifying whether the memory cell has been correctly programmed to S7, in step 2106, the system applies Vv7 to the word line connected to the control gate of the memory cell being verified. In step 2108, the system senses the current that flowed through the memory cell being verified while the verify voltage was applied to the control gate of the memory cell during step 2106 and while keeping the bit line voltage constant. As mentioned above, in one embodiment, sensing this current may involve sensing the change in the voltage on the charge storage device that was pre-charged in step 2104 and whether or not this change in voltage exceeds a predetermined amount. The change in voltage sensed for this embodiment depends on the pre-charge voltage determined in step 2102, and, consequently, on the position of the memory cell being verified. The system may test for the change in voltage of the charge storage device by testing the voltage of the charge storage device after the strobe time. If the voltage of the charge storage device is below a reference, then it is assumed that the current through the memory cell was greater than the reference current; therefore, the reference voltage tested for (Vv) is greater than or equal to the threshold voltage of the memory cell (step 2110) and the verification processes failed (step 2112). If the voltage of the charge storage device is not below the reference, then it is assumed that the current through the memory cell was not greater than the reference current; therefore, the reference voltage tested for (Vv) is less the threshold voltage of the memory cell (step 2110) and the verification processes passed (step 2114).

Figure 22:
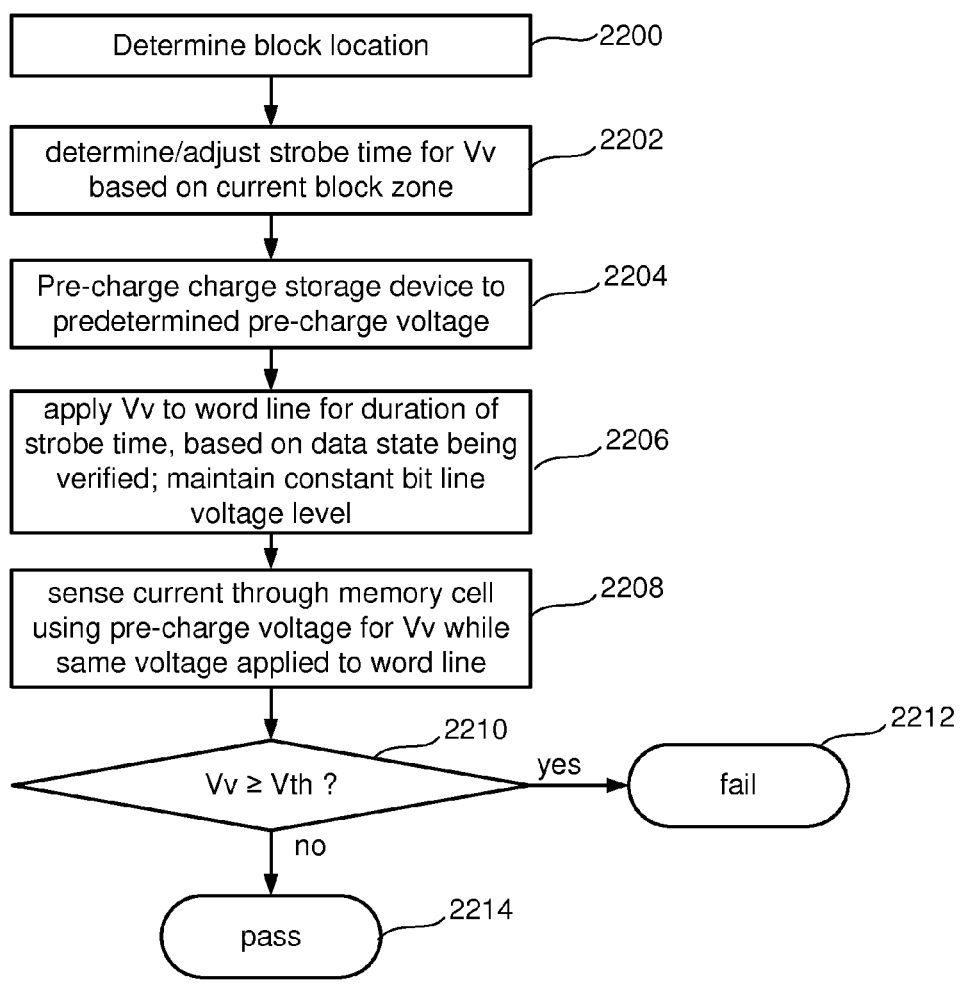
FIG. 22 is a flow chart depicting one embodiment of a verify process.

FIG. 22 is a flow chart depicting one embodiment of a process for performing verification during a programming process. The method depicted in FIG. 22 is one example implementation of the method of FIG. 20A or of steps 574 and 576 of FIG. 11. In step 2200 of FIG. 22, the system determines the position of the memory cell whose programming is being verified. In one embodiment, with reference to FIG. 19, the system determines, with relation to sense module(s) 480, the location of the block of the memory cell which is being verified. In another embodiment, the system determines the position of the word line which is connected to the memory cell which is being verified. In step 2202, the system uses the information obtained in step 2200 to determine the duration of time (or strobe time) for which the current flows through the memory cell being verified if the verify voltage exceeds the threshold voltage. In one embodiment, this duration of time depends both on the position of the memory cell which is being verified, as well as the data state for which the memory cell is being verified. For example, in some cases, for a given memory cell, the current through the memory cell when Vv1 (referring to FIG. 8) is applied to the control gate may differ significantly enough from the current through the memory cell when one or more of Vv2-Vv7 are applied to the memory cell that the duration of time during which this current flows may have to vary accordingly. In step 2204, the system pre-charges the charge storage device in the sensing circuit to a predetermined voltage. As explained above, in some embodiments, this pre-charge voltage may depend on the data state being verified.

In step 2206, for the data state being verified, the system applies the appropriate verify voltage to the word line to which the memory cell is connected maintaining the voltage level of the bit line to which the memory cell is connected at a constant value. For example (referring to FIG. 8), if the system is verifying whether the memory cell has been correctly programmed to S7, in step 2206 the system applies Vv7 to the word line connected to the control gate of the memory cell being verified. The verify voltage is applied for the duration of time determined in step 2202. In step 2208, the system senses the current that flowed through the memory cell being verified while the verify voltage was applied to the control gate of the memory cell during step 2206 and while maintaining a constant bit line voltage. As mentioned above, in one embodiment, sensing this current may involve sensing the change in the voltage on the storage charge device that was pre-charged in step 2204, and whether or not this change in voltage exceeds a predetermined amount. The change in voltage sensed for this embodiment depends on the duration of time determined in step 2202, and, consequently, on the position of the memory cell being verified.

The system may test for the change in voltage of the charge storage device by testing the voltage of the charge storage device after the strobe time. If the voltage of the charge storage device is below a reference, then it is assumed that the current through the memory cell was greater than the reference current; therefore, the reference voltage tested for (Vv) is greater than or equal to the threshold voltage of the memory cell (step 2210) and the verification processes failed (step 2212). If the voltage of the charge storage device is not below the reference, then it is assumed that the current through the memory cell was not greater than the reference current; therefore, the reference voltage tested for (Vv) is less the threshold voltage of the memory cell (step 2210) and the verification processes passed (step 2214).

Figure 23:
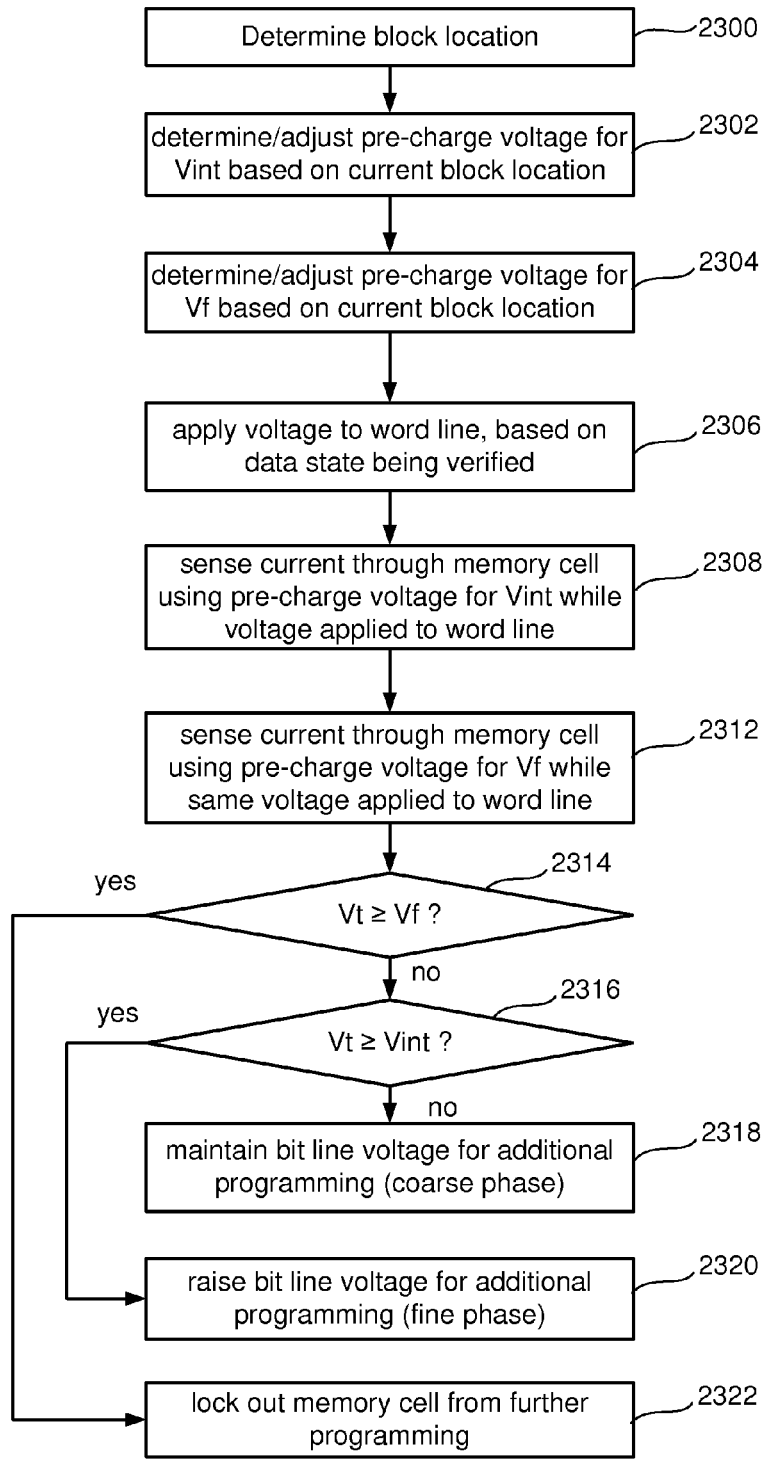
FIG. 23 is a flow chart depicting one embodiment of a multi-phase verify process.

FIG. 23 is a flow chart depicting one embodiment of a process for performing verification during a programming process. The method depicted in FIG. 23 is one example implementation of the process of FIG. 20A or step 574 of FIG. 11. In step 2300 of FIG. 23, the system will sense determine the position of the memory cell being sensed. In some embodiments, the information that the system obtains about the position of the memory cell being sensed is with respect to the sensing circuit (such as Sensing Circuit 470) that is sensing the memory cell. In further embodiments, the information about the position of the memory cell being sensed comprises the block address of the memory cell being sensed, whereas in other embodiments, this information comprises the word line address of the memory cell being sensed.

In step 2302, the system will determine/adjust the pre-charge voltage of charge storage device 600 for the intermediate voltage compare point Vint based on the position of the memory cell/s being sensed. In step 2304, the system will determine/adjust the pre-charge voltage of charge storage device 600 for the final verify compare value Vf based on the position of the memory cell being sensed. In some embodiments, step 2302 is performed, but step 2304 is not performed. In other embodiments, step 2304 is performed, but step 2302 is not performed. In some embodiments, both steps 2302 and 2304 are both performed.

In step 2306, a voltage is applied to the word line for the selected memory cell being programmed and verified while maintaining the voltage level of the bit line to which the memory cell is connected at a constant value. This word line voltage is applied based on the data state being verified. As explained above, different control gate voltages are used to verify programming to different data states. As discussed above, for each data state, there will be two sensing operations, one for the respective Vf and one for the respective Vint. The same word line voltage will be applied to the word line for both sensing operations for a given data state. In step 2308, the system will sense current through the memory cell for the first sensing operation using the pre-charge voltage for Vint while the voltage (see step 806) is applied to the word line. Step 2308 is the first sensing operation. In step 2312, the system will sense current through the memory cell using the pre-charge voltage for Vf while the same voltage is applied to the word line. Step 2312 is the second sensing operation. Step 2308 effectively tests whether the nonvolatile storage element has a threshold voltage of at least Vint by sensing whether nonvolatile storage element has less than the current level Iint while applying the voltage level to the control gate (see step 2306). Note that the current level Iint is indicative of the threshold voltage level Vint for a memory cell at a particular position. Step 2312 is effectively testing whether nonvolatile storage element has a threshold voltage of Vf by sensing whether nonvolatile storage element has less than the current level If while applying the same control gate voltage as in step 2308. Step 2302 includes adjusting Iint and step 2304 includes adjusting If based on (as a function of) the position of the memory cell being sensed such that the differences between the threshold voltage represented by the adjusted one or more current levels is constant over position of the memory cell/s being sensed. That is, Δ remains constant over the position of the memory cell/s being sensed.

If it is determined that the threshold voltage of the memory cell is greater than or equal to Vf (see step 2314), then in step 2322 that memory cell is locked out from further programming for this particular programming process. In some embodiments, step 2322 is omitted so that the sensing of the memory cell does not terminate in locking out the memory cell, and the system proceeds to the next operation. Omitting step 2322 may be useful in avoiding the delay in settling time associated with locking out the memory cell. If, however, it is determined that the threshold voltage of the memory cell is less than Vf, then it is tested whether the threshold voltage in memory cell is greater than or equal to Vint (step 2316). If the threshold voltage in the memory cell is greater than or equal to Vint, then in step 2320, the bit line voltage is raised to Vs, as discussed above, to slow down programming and enter the fine phase. In some embodiments, step 2320 is omitted in order to avoid changing bit line voltage levels. If the threshold voltage is below the Vint, then in step 2318, the bit line voltage is maintained at Vs so that additional coarse programming can be performed.

In one embodiment, steps 2314 and 2316 are implemented to determine that the nonvolatile storage element has a threshold voltage greater than Vf if the nonvolatile storage element has a current that is less than Iint while applying the voltage to the word line from step 2306. If the nonvolatile storage element has a current less than Iint, then the nonvolatile storage element has a threshold voltage greater than Vint. If the nonvolatile storage element has a current that is less than the current level Iint and greater than If, the nonvolatile storage element has a threshold voltage between Vint and Vf. If the nonvolatile storage element has a current greater than or equal to Iint, then the threshold voltage of the nonvolatile storage element is less than Vint. As discussed above with respect to FIG. 11, the process of FIG. 23 is performed after applying a common programming pulse to the control gate of the nonvolatile storage element and for the purpose of verifying whether the nonvolatile storage element is properly programmed in response to the most previous programming pulse.

Figure 24:
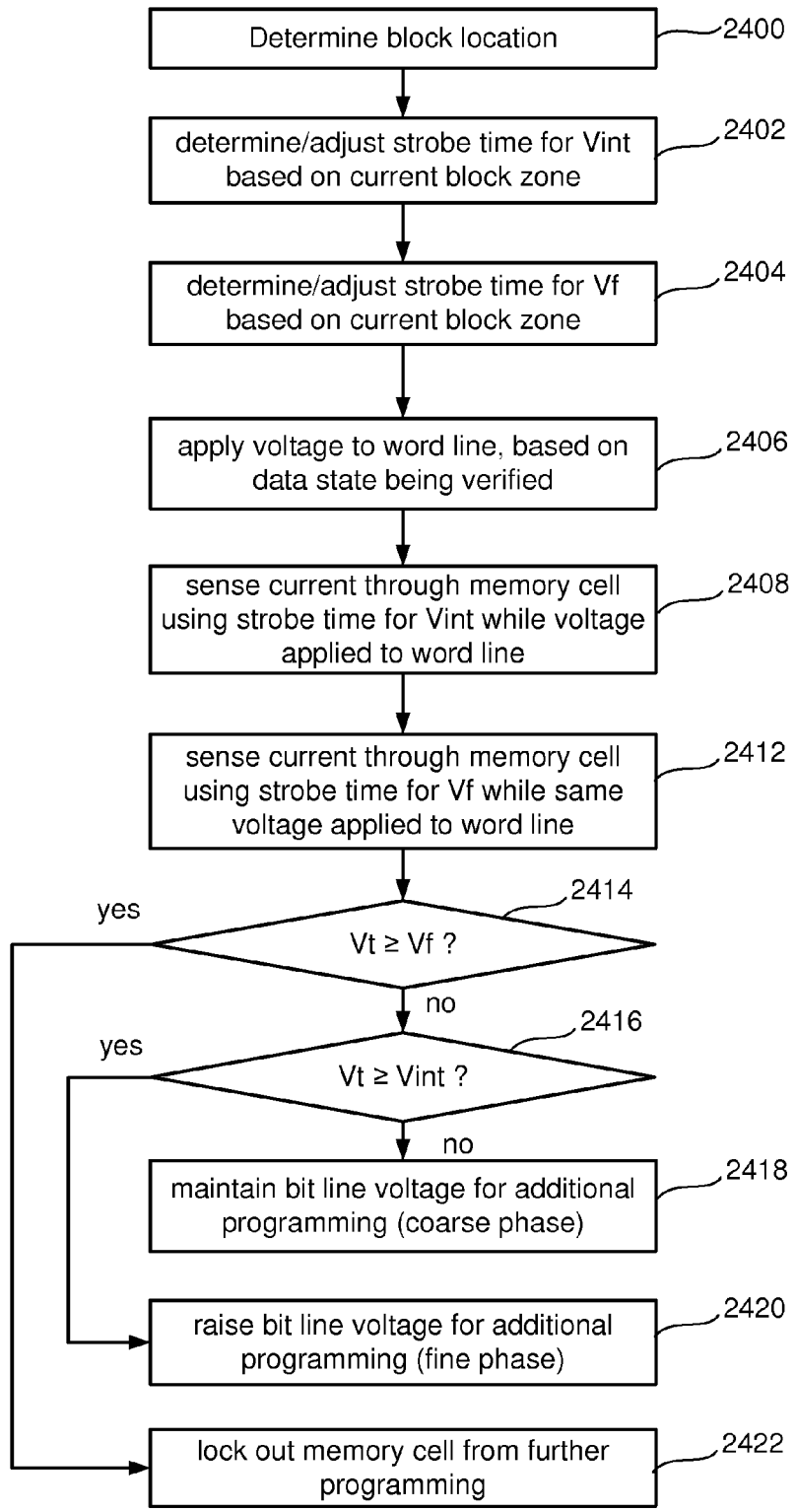
FIG. 24 is a flow chart depicting one embodiment of a multi-phase verify process.

FIG. 24 is a flow chart depicting one embodiment of a process for performing verification during a programming process. The method depicted in FIG. 24 is one example implementation of the process of FIG. 20A or step 574 of FIG. 11. In step 2400 of FIG. 24, the system will sense determine the position of the memory cell being sensed. In some embodiments, the information that the system obtains about the position of the memory cell being sensed is with respect to the sensing circuit that is sensing the memory cell. In further embodiments, the information about the position of the memory cell being sensed comprises the block address of the memory cell being sensed, whereas in other embodiments, this information comprises the word line address of the memory cell being sensed. In step 2402, the system will determine/adjust the strobe time for the intermediate voltage compare point Vint based on the position of the memory cell/s being sensed. In step 2404, the system will determine/adjust the strobe time for the final verify compare value Vf based on the position of the memory cell being sensed. In some embodiments, step 2402 is performed, but step 2404 is not performed. In other embodiments, step 2404 is performed, but step 2402 is not performed. In some embodiments, both steps 2402 and 2404 are both performed.

In step 2406, a voltage is applied to the word line for the selected memory cell being programmed and verified while maintaining the voltage level of the bit line to which the memory cell is connected at a constant value. This word line voltage is applied based on the data state being verified. As explained above, different control gate voltages are used to verify programming to different data states. As discussed above, for each data state, there will be two sensing operations, one for the respective Vf and one for the respective Vint. The same word line voltage will be applied to the word line for both sensing operations for a given data state. In step 2408, the system will sense current through the memory cell for the first sensing operation using the pre-charge voltage for Vint while the voltage (see step 2406) is applied to the word line. Step 2408 is the first sensing operation. As explained in more detail in FIG. 26, the system waits for the strobe time determined in step 2402 before sensing whether the current that has flowed through the memory cell being sensed exceeds a predetermined value. In step 2412, the system will sense current that flowed through the memory cell using the pre-charge voltage for Vf while the same voltage is applied to the word line. Step 2412 is the second sensing operation. As explained in more detail in FIG. 26, the system waits for the strobe time determined in step 2404 before sensing the current that has flowed through the memory cell being sensed exceeds a predetermined value. Step 2408 effectively tests whether the nonvolatile storage element has a threshold voltage of at least Vint by sensing whether nonvolatile storage element has less than the current level Iint while applying the voltage level to the control gate (see step 2406). Note that the current level Iint is indicative of the threshold voltage level Vint for a memory cell at a particular position. Step 2412 is effectively testing whether nonvolatile storage element has a threshold voltage of Vf by sensing whether nonvolatile storage element has less than the current level If while applying the same control gate voltage as in step 2408. Step 2402 includes adjusting Iint and step 2404 includes adjusting If based on (as a function of) the position of the memory cell/s being sensed such that the differences between the threshold voltage represented by the adjusted one or more current levels is constant over position of the memory cell/s being sensed. That is, Δ remains constant over the position of the memory cell/s being sensed.

If it is determined that the threshold voltage of the memory cell is greater than or equal to Vf (see step 2414), then in step 2422 that memory cell is locked out from further programming for this particular programming process. In some embodiments, step 2422 is omitted so that the sensing of the memory cell does not terminate in locking out the memory cell, and the system proceeds to the next operation. Omitting step 2422 may be useful in avoiding the delay in settling time associated with locking out the memory cell. If, however, it is determined that the threshold voltage of the memory cell is less than Vf, then it is tested whether the threshold voltage in memory cell is greater than or equal to Vint (step 2416). If the threshold voltage in the memory cell is greater than or equal to Vint, then in step 2420, the bit line voltage is raised to Vs, as discussed above, to slow down programming and enter the fine phase. In some embodiments, step 2420 is omitted in order to avoid changing bit line voltage levels. If the threshold voltage is below the Vint, then in step 2418, the bit line voltage is maintained at Vs so that additional coarse programming can be performed.

In one embodiment, steps 2414 and 2416 are implemented to determine that the nonvolatile storage element has a threshold voltage greater than Vf if the nonvolatile storage element has a current that is less than Iint while applying the voltage to the word line from step 2406. If the nonvolatile storage element has a current less than Iint, then the nonvolatile storage element has a threshold voltage greater than Vint. If the nonvolatile storage element has a current that is less than the current level Iint and greater than If, the nonvolatile storage element has a threshold voltage between Vint and Vf. If the nonvolatile storage element has a current greater than or equal to Iint, then the threshold voltage of the nonvolatile storage element is less than Vint. As discussed above with respect to FIG. 11, the process of FIG. 24 is performed after applying a common programming pulse to the control gate of the nonvolatile storage element and for the purpose of verifying whether the nonvolatile storage element is properly programmed in response to the most previous programming pulse.

Figure 25:
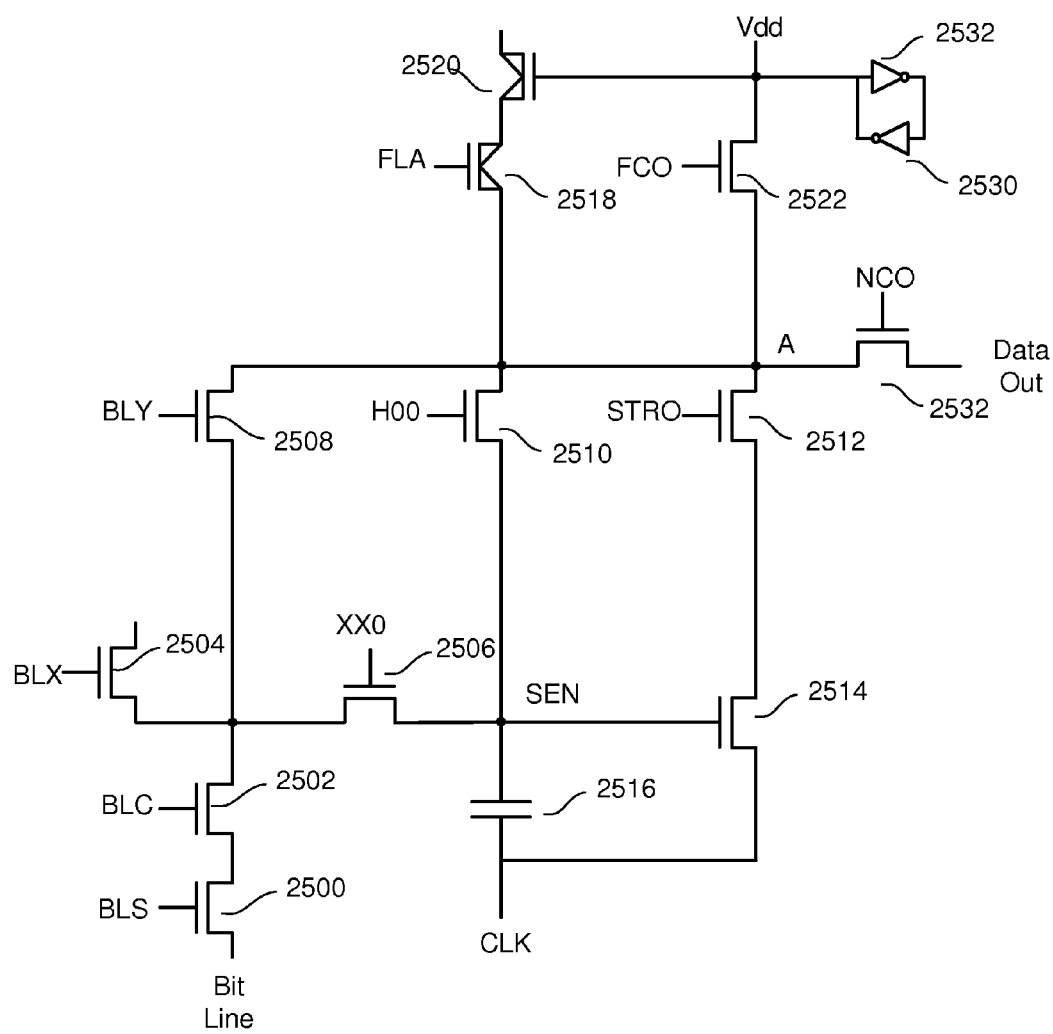
FIG. 25 is a schematic diagram of one embodiment of sense circuitry.

FIG. 25 is a schematic diagram depicting a circuit from sense circuitry 470 (see FIG. 4). FIG. 25 is one example implementation of charge storage device 600, bit line connection circuit 602, pre-charge circuit 604, result detection circuit 606, and strobe timer circuit 608 of FIG. 20. As described below, the circuit of FIG. 25 will pre-charge a capacitor (or other charge storage device) to a pre-charge magnitude, discharge the capacitor through the memory cell for a strobe time, and sense voltage at the capacitor after the strobe time. The strobe time and/or the pre-charge magnitude can be based on the position of the memory cell being sensed with respect to the sense amplifier. Though FIG. 25 features one capacitor, in some embodiments, any suitable charge storage device can replace or complement this capacitor. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then, during a verify operation, the memory cell will enter the fine phase or complete programming, as appropriate based on the processes described above. Thus, the circuit of FIG. 25 can be used for the coarse/fine programming discussed above or for other systems that do not use coarse/fine programming. In some embodiments, the circuit of FIG. 25 can be used for read operations.

FIG. 25 shows transistor 2500 connected to the Bit Line and transistor 2502. Transistor 2500 receives the signal BLS at its gate, and is used to connect to or isolate the Bit Line. Transistor 2502 receives the signal BLC at its gate, and is used as a voltage clamp. The gate voltage BLC is biased at a constant voltage equal to the desired Bit Line voltage plus the threshold voltage of transistor 2502. The function of transistor 2502, therefore, is to maintain a constant Bit Line voltage during a sensing operation (during read or verify), even if the current through the Bit Line changes.

Transistor 2502 is connected to transistors 2504, 2506 and 2508. Transistor 2506 is connected to capacitor 2516. The purpose of transistor 2506 is to connect capacitor 2516 to Bit Line 2500 and disconnect capacitor 2516 from Bit Line 2500 so that capacitor 2516 is in selective communication with Bit Line 2500. In other words, transistor 2506 regulates the strobe time mentioned above with respect to step 856. That is, while transistor 2506 is turned on capacitor 2516 can discharge through the Bit Line, and when transistor 2506 is turned off capacitor 2516 cannot discharge through the Bit Line.

The node at which transistor 2506 connects to capacitor 2516 is also connected to transistor 2510 and transistor 2514. Transistor 2510 is connected to transistors 2508, 2512 and 2518. Transistor 2518 is also connected to transistor 2520. Transistors 2518 and 2520 are PMOS transistors while the other transistors of FIG. 25 are NMOS transistors. Transistors 2510, 2518, and 2520 provide a pre-charging path to capacitor 2516. A voltage (e.g. Vdd or other voltage) is applied to the source of transistor 2520. By appropriately biasing transistors 2510, 2518 and 2520, the voltage applied to the source of transistor 2520 can be used to pre-charge capacitor 2516. After pre-charging, capacitor 2516 can discharge through the Bit Line via transistor 2506 (assuming that transistors 2500 and 2502 are conducting).

The circuit of FIG. 25 includes inverters 2530 and 2532 forming a latch circuit. The output of inverter 2532 is connected to the input of inverter 2530 and the output of inverter 2530 is connected to the input of inverter 2532. As well as transistors 2520 and 2522. The input of inverter 2532 will receive Vdd and the two inverters 2530, 2532 will act as a latch to store Vdd. The input of inverter 2532 can also be connected to another value. Transistors 2512 and 2522 provide a path for communicating the data stored by inverters 2530 and 2532 to transistor 2514. Transistor 2522 receives the signal FCO at its gate. Transistor 2512 receives the signal STRO at its gate. By raising or lowering FCO and STRO, a path is provided or cut off between the inverters 2530, 2532 and transistor (sensing switch) 2514. The gate of transistor 2514 is connected capacitor 2516, transistor 2506 and transistor 2510 at the node marked SEN. The other end of capacitor 2516 is connected to the signal CLK.

As discussed above, capacitor 2516 is pre-charged via transistors 2510, 2518 and 2520. This will raise the voltage at the node SEN to a pre-charge voltage level (Vpre). When transistor 2506 turns on, capacitor 2516 can discharge its charge through the Bit Line and the selected memory cell if the threshold voltage of the memory cell is below the voltage level being tested for. If the capacitor 2516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 2514 is on (conducting). Since transistor 2514 is on during the strobe time, then transistor 2512 should be off. If the capacitor does not discharge during the strobe time, then the voltage at the SEN node will remain above the threshold voltage of transistor 2514 and the charge at the inverters 2530, 2532 can be discharged into the CLK signal when STRO turns on transistor 2512. If the capacitor discharges sufficiently during the strobe time, then the voltage at the SEN node will decrease below the threshold voltage of transistor 2514; thereby, turning off transistor 914 and the data (e.g., Vdd) stored at inverters 2530, 2532 from being discharged through CLK. So testing whether the diodes 2530, 2532 maintain their charge or discharge will indicate the result of the verification process. In one embodiment, the result can be read at node A via transistor 2534 (Data Out) by turning on transistor 2534 gate signal NCO.

The pre-charge level of capacitor 2516 (and, thus, the pre-charge voltage at node SEN) is limited by the current passing through transistor 2510. The current that passes through transistor 2510 is limited by the gate voltage H00. As such, the pre-charge voltage at node SEN is limited by the voltage H00 less the threshold voltage of transistor 2510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read operation, the voltage applied to the control gate of the cell may cause the channel (connected to the bit line) of the cell to conduct. If this happens, a capacitor is discharged through the channel, lowering in voltage as it discharges.

Figure 26:
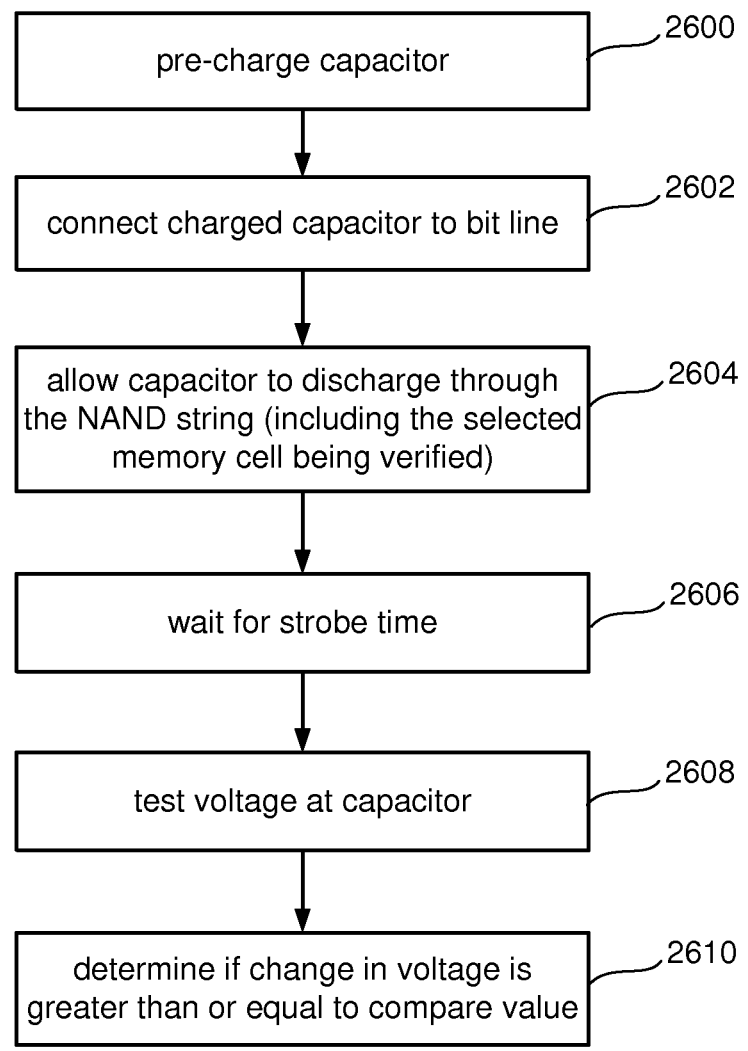
FIG. 26 is a flow chart describing one embodiment of a process for sensing current through a memory cell.

FIG. 26 is a flowchart describing one embodiment for sensing current through the memory cell, and includes one example implementation of steps 2308/2408, 2312/2412, and 2810/2910. The process of FIG. 26 can be executed by the circuit of FIG. 25. For the processes of FIGS. 23 and 24, the process of FIG. 26 will be performed once for implementing step 2308/2408 and another time for implementing step 2312/2412, respectively. The embodiment of FIG. 26 assumes a structure in which a charge storage device will discharge its charge through the selected memory cell in order to detect current. One example of such a structure is depicted at least in part by FIG. 25, as described above. In the example of FIG. 26, the charge storage device 600 comprises a capacitor. However, in other embodiments, other types of charge storage devices can also be used.

In step 2600 of FIG. 26, the capacitor (or other charge storage device) will be pre-charged to a pre-determined voltage level. In some embodiments, the pre-charge level is determined based on the distance from the memory cell (or block or word line) to the sense amplifier. In step 2602, the pre-charged capacitor (or other charge storage device) will be connected to the bit line (see Bit line Connection Circuit 602).

In step 2604, the capacitor will be allowed to discharge its charge through the bit line and NAND string (including the selected memory cell being verified). The system will wait for the strobe time in step 2606. As discussed above, the strobe time can be adjusted based on the position of the memory cell being sensed. At the conclusion of the strobe time (step 2608), the system (e.g., result detection circuit 606) will test the voltage across the capacitor. The system will calculate the change in voltage across the capacitor from the pre-charge voltage to the voltage detected in step 2608. In step 2610, this calculated change in voltage is compared to a compare value. If the change in voltage is greater than or equal to the compare value, then it is assumed that the memory cell conducted current greater than the current level being sensed for.

Figure 27:
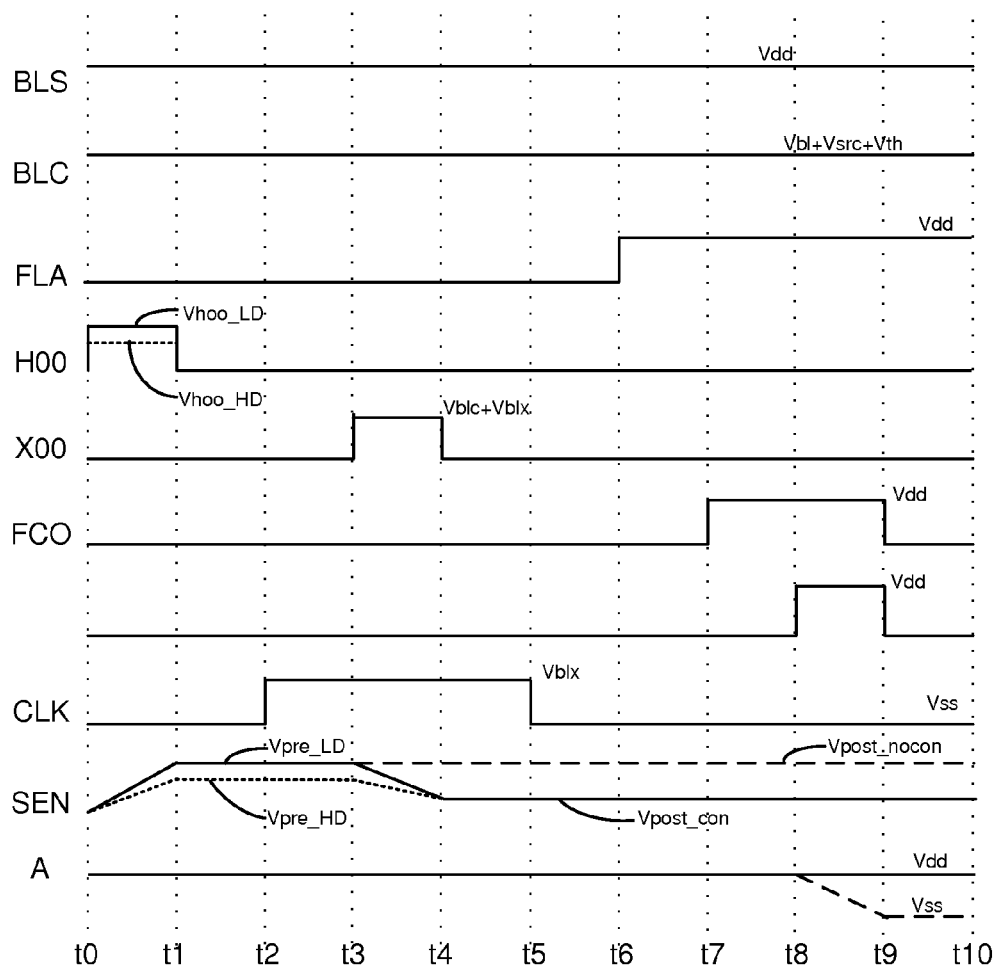
FIG. 27 is a timing diagram that describes the behavior of signals depicted in FIG. 25.

FIG. 27 is a timing diagram describing the behavior of various signals from FIG. 25. The signal BLS is at Vdd the entire time depicted and the signal BLC is at Vb1+Vsrc+Vth, where Vb1 is the voltage of the Bit Line, Vsrc is the voltage of the source line and Vth is the threshold voltage of transistor 902. The signal FLA starts at Vss at t0 and goes to Vdd at T6. When the signal FLA is at Vss, the pre-charging path is regulated by transistor 2510. As explained above with respect to FIG. 27, the voltage of H00 is a function of the position of the memory cell being sensed. At t0, the voltage of H00 is raised to a pre-charge level. The raising of the voltage at H00 turns on transistor 2510 and opens up the pre-charge path. The magnitude of the voltage at H00 is set. There will be a larger voltage magnitude at H00 for memory cells that are closer to the sensing circuit. The magnitude of H00 is smaller for memory cells that are further from the sensing circuit. FIG. 27 shows H00 going to Vhoo_LD for memory cells close to the sensing circuit or Vhoo_HD for memory cells far from the circuit, with Vhoo_LD>Vhoo_HD. Note that in some embodiments, the circuit of FIG. 25 produces more than two voltage magnitudes. In one embodiment, the output of the circuit of FIG. 25 is linear function with respect to position of the memory cell being sensed so that there are many different possible voltage magnitudes for H00, depending on position of the memory cell being sensed. Two examples of voltage magnitudes are depicted in FIG. 27 for the signal H00. The signal H00 will stay at the pre-charge voltage (Vhoo_LD or Vhoo_HD) until time t1. While H00 is high, transistor 2510 turns on and capacitor 2516 will pre-charge between T0 and T1, as depicted by the voltage at SEN (depicted second from the bottom on FIG. 24). At time t1, H00 is brought down to Vss and the pre-charging is completed.

The signal X00 is used to allow capacitor 2516 to be in communication with the Bit Line so that the capacitor can discharge through the Bit Line and selected memory cell. At time t3, X00 is raised to Vb1c+Vb1x, where Vb1c is the voltage of the signal BLC and Vb1x is the voltage of the signal BLX (both discussed above). At time t4, the voltage at X00 is lowered to Vss. Between times t3 and t4, capacitor 2516 will be in communication with the Bit Line in order to allow it to discharge as charged through the Bit Line and the selected memory cell (depending on the threshold voltage of the selected memory cell). The signal CLK is raised to Vb1x at time t2 and lowered back down to Vss at time T5 to prevent any fighting conditions in the circuit and to allow proper discharge of capacitor 2516.

As discussed above, because H00 is raised between t0 and t1, capacitor 2516 (and SEN node) will charge up between t0 and t1 (the pre-charge). This is depicted in FIG. 27 with the SEN node charging from Vss to either Vpre_LD or Vpre_HD. The solid line for Vpre_LD represents an example pre-charging of the node SEN when the memory cell being sensed is close to the sensing circuit, in response to Vh00_LD being applied to the gate of transistor 2510. The dotted line Vpre_HD is one example of charging of the node SEN (and capacitor 2516) in response to the signal Vh00 HD—when the memory cell being sensed is close to the sensing circuit.

When X00 is raised up at t3, capacitor 2516 can discharge through the Bit Line (if the threshold voltage is at the appropriate level). As depicted in FIG. 27 between t3 and t4, both Vpre_LD and Vpre_HD will discharge to the same level, Vpost_con. If the threshold voltage for the memory cell being tested is high enough, capacitor 2516 will not discharge and the voltage will remain at Vpre_LD (indicated by—line Vpost_nocon) or will remain at the level Vpre_HD (not depicted in FIG. 27). The period between t4 and t3 is the strobe time and can be adjusted, as described above.

FIG. 27 shows that the signal FCO is raised to Vdd at t7 and lowered to Vss at T9. The signal STRO is raised to Vdd at t8 and lowered at t9. Between times t8 and t9, there is a path between the inverters 2530, 2532 and transistor 2514. If the voltage at the node SEN is greater than the threshold voltage of transistor 2514, then there will be a path from the inverters 2530, 2532 to CLK and the data at the inverters 2530,932 will dissipate through the signal CLK and through the transistor 2514. If the voltage at the node SEN is lower than threshold voltage of transistor 2514 (e.g. if the capacitor discharged), then transistor 2514 will turn off and the voltage stored by the inverters 2530, 2532 will not dissipate into CLK. FIG. 27 shows the voltage level at A at Vdd. If the voltage of the capacitor does not dissipate (e.g., due to not enough current flowing because the threshold voltage of the selected memory cell is greater than the voltage being tested for), then transistor 2514 will remain on and the voltage at node A will remain dissipate to Vss (as depicted by the dashed line). If the voltage of the capacitor does dissipate (e.g., due to sufficient current flowing because the threshold voltage of the selected memory cell is below the voltage being tested for), then transistor 2514 will turn off and the voltage at node A will remain at Vdd (as depicted by the solid line). The output of node A is provided to the Data Out signal via transistor 2534 by applying Vdd to the signal NCO.

The description of the disclosed technology thus far applies to the determining of sensing parameters (based on position of memory cell being sensed) for verify operations. However, in embodiments described below (FIGS. 28-30), sensing parameters can also be determined (based on position of memory cell being sensed) for read operations.

Figure 28:
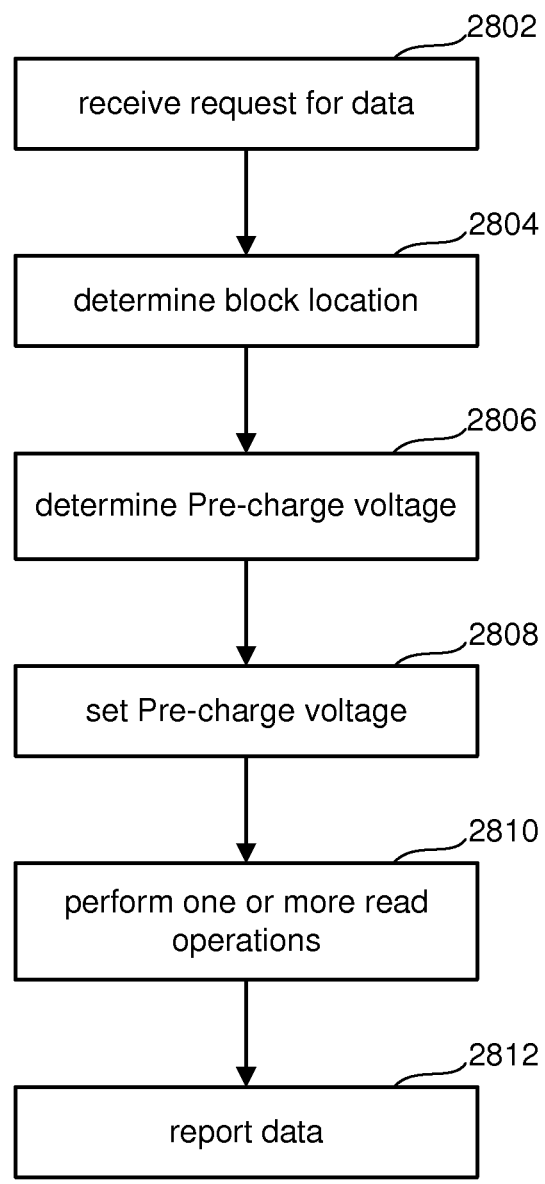
FIG. 28 is a flow chart describing one embodiment of a process for reading data.

FIG. 28 is a flow chart describing one embodiment of a process for reading data. The process depicted in FIG. 28 is one example implementation of step 526 of FIG. 6. In step 2802, a request for data to be read is received. The request can be received from a host, a user, controller or other entity. The request is received at Control Circuitry 220. In one alternative, the request is received at the Controller 244. In some embodiments, step 2802 can be skipped and the read process can be performed without a request. For example, the read process may be used to verify programming.

In step 2804, Control Circuitry 220 determines the position of the memory cell being sensed. In one embodiment, the position of the memory cell is with respect to its respective sensing circuit. In one embodiment, a request to read data or a verify operation includes an address of the data to be read. Control Circuitry 220 (or Controller 244) can determine which block (by obtaining the block address) includes the word line connected to the memory cells at that address. In one embodiment, the system obtains the word line address corresponding to the memory cell being sensed. In another embodiment, the system obtains information about the block zone (see description of FIG. 19) in which the memory cell being sensed is located. Once knowing the block (or word line), the pre-charge voltage of charge storage device 600 can be determined in step 2806. In step 2808, the pre-charge voltage is set by, for example, storing the digital value corresponding to the determined (step 2806) pre-charge voltage in registers. In step 2810, one or more parallel read operations are performed using the pre-charge voltage set in step 2808. For example, the pre-charge voltage may be obtained by passing the digital value stored in step 2808 through a digital-to-analog converter. In step 2812, the data read in the one or more parallel read operations is reported to the controller, host, user, and/or other entity.

Figure 29:
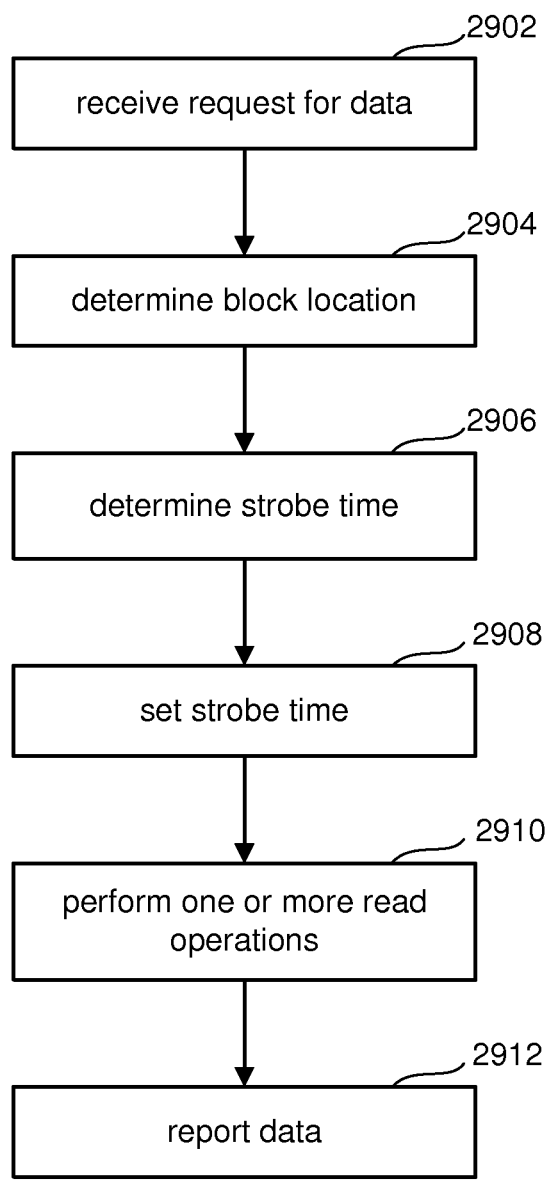
FIG. 29 is a flow chart describing one embodiment of a process for reading data.

FIG. 29 is a flow chart describing one embodiment of a parallel process for reading data. The process depicted in FIG. 29 is one example implementation of step 526 of FIG. 6. In step 2902, a request for data to be read is received. The request can be received from a host, a user, controller or other entity. The request is received at Control Circuitry 220. In one alternative, the request is received at the Controller 244. In some embodiments, step 2902 can be skipped and the read process can be performed without a request. For example, the read process may be used to verify programming.

In step 2904, Control Circuitry 220 determines the position of the memory cell being sensed. In one embodiment, the position of the memory cell is with respect to its respective sensing circuit. In one embodiment, a request to read data or a verify operation includes an address of the data to be read. Control Circuitry 220 (or Controller 244) can determine which block includes the word line connected to the memory cells at that address. In one embodiment, the system obtains the word line address corresponding to the memory cell being sensed. In another embodiment, the system obtains information about the block zone (see description of FIG. 19) in which the memory cell being sensed is located. Once knowing the block (or word line), the strobe time can be determined in step 2906. In one embodiment, the strobe time is determined by strobe time determination circuit. In step 2908, the strobe time is set by, for example, storing the digital value corresponding to the determined (step 2806) strobe time in registers. In step 2910, one or more parallel read operations are performed using the strobe time set in step 2908. In step 2912, the data read in the one or more parallel read operations is reported to the controller, host, user, and/or other entity.

Figure 30:
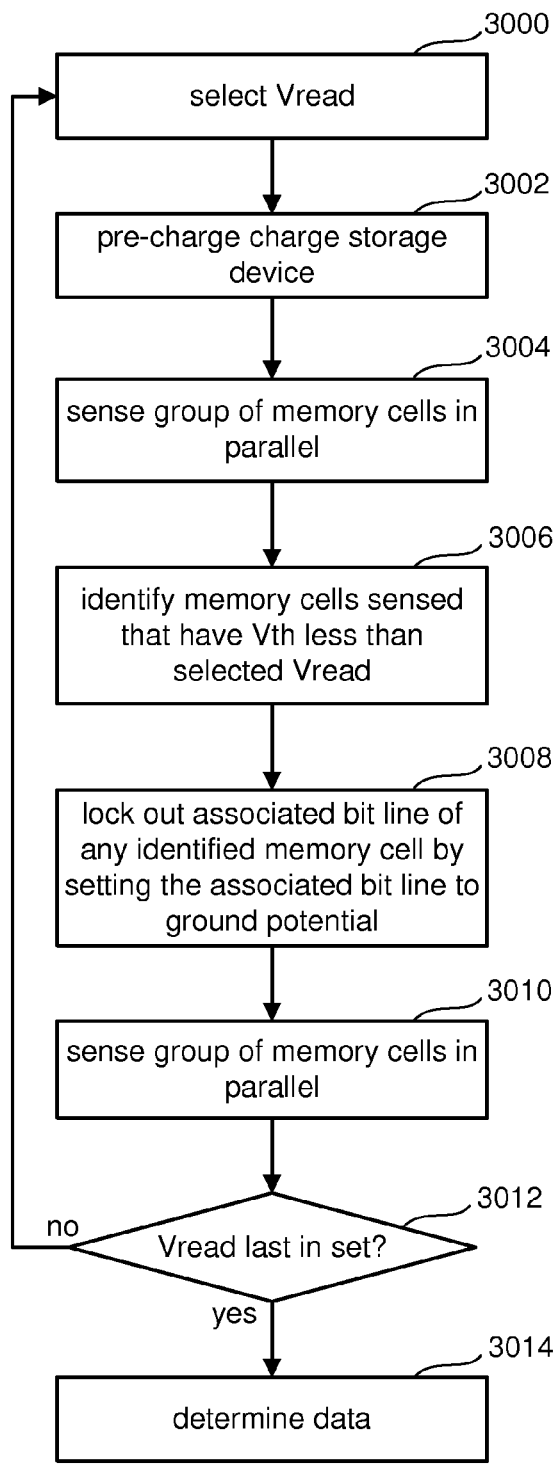
FIG. 30 is a flow chart describing one embodiment of a process for performing one or more read operations.

FIG. 30 is a flow chart describing one embodiment of a process for performing one or more read operations (see step 2810/2910 of FIGS. 28/29). In one embodiment, each read operation reads multiple memory cells at the same time. In one embodiment, the memory cells are connected to the same word line. In step 3000, a demarcation Vth is selected. As described above, a read process may need to perform sensing operations at multiple compare points to determine which state the memory cell is in. Each of the compare points is a demarcation threshold voltage (Vth). For example, when verifying, the demarcation Vths includes Vv1, Vv2, Vv3, Vv4, Vv5, Vv6 and Vv7. When reading, the demarcation Vths includes Vr1, Vr2, Vr3, Vr4, Vr5, Vr6 and Vr7. In step 3000, one of these values is chosen.

In step 3002, the selected word line (common to the selected memory cells connected to the top and bottom) is pre-charged to the demarcation Vth. In another embodiment, the selected word line is pre-charged to an intermediate value and then subsequently raised to the demarcation value. In step 3004, the parameters are read and the bit lines are simultaneously pre-charged based on the parameters, as explained above. Some bit lines will get the higher bit line voltage. Some bit lines will get the lower bit line voltage. However, in some embodiments, the voltage level on the bit lines of the memory cells being sensed will be maintained at a constant value. Step 3004 includes reading the parameters. In step 3004, the selected memory cells connected to the selected word line will be sensed (first pass) during the same time period to see if their respective threshold voltage is less than the demarcation Vth. In step 3006, the memory cells that have a threshold voltage less than the demarcation Vth are identified. In step 3008, the bit lines associated with the memory cells that have a threshold voltage less than the demarcation Vth are locked out from the second pass by setting those bit lines to ground potential. In some embodiments, step 3008 is omitted in order to avoid the RC delay involved in locking out memory cells. In step 862, the selected memory cells that have not been locked out will be sensed (second pass) to see if their respective threshold voltage is less than the demarcation Vth. If there are more demarcation Vths to consider (step 3012), then the process continues at step 3000 and the next demarcation Vth is considered. If there are no more demarcation Vths to consider (step 3012), then the process continues at step 3014 and the data values are determined based on which state the memory cells are in.

The foregoing description discloses systems and methods for determining sensing parameters for memory cells based on the position of these memory cells. Upon selecting memory cells to be sensed, the systems obtain information about the position of these memory cells, determines sensing parameters based at least in part on this information, pre-charges a charge storage device, and, while maintaining the voltage level of the bit lines of these memory cells at a constant value, applies a reference signal to these memory cells for a certain duration of time, afterwards determining whether, for the certain duration of time, the current conducted by these memory cells exceeds a predetermined value.

One embodiment comprises a method for sensing a non-volatile storage element comprising: obtaining information about the position of the non-volatile storage element; determining a sensing parameter, at least in part based on the information obtained about the position of the non-volatile storage element; pre-charging a charge storage device in a sensing circuit, the charge storage device is in communication with a bit line, the non-volatile storage element is in communication with the bit line; applying a reference signal to the non-volatile storage element while maintaining a constant voltage level on the bit line; and based on the determined sensing parameter, sensing whether current conducted by the non-volatile element exceeds a pre-determined value in response to the reference signal while maintaining a constant voltage level on the bit line.

One embodiment comprises a non-volatile storage system, comprising: a plurality of non-volatile storage elements; a plurality of bit lines connected to the non-volatile storage elements; one or more managing circuits in communication with the non-volatile storage elements, the one or more managing circuits obtain information about the position of a non-volatile storage element, determine a sensing parameter at least in part based on the information obtained about the position of the non-volatile storage element, pre-charge a charge storage device in a sensing circuit such that the charge storage device is in communication with a bit line and the non-volatile storage element is in communication with the bit line, apply a reference signal to the non-volatile storage element, and based on the determined sensing parameter sense whether current conducted by the non-volatile element exceeds a pre-determined value while maintaining a constant voltage level on the bit line.

One embodiment comprises a method for sensing a non-volatile storage element comprising: obtaining information about the position of the non-volatile storage element; determining a duration of time for which the non-volatile storage element may be sensed based on the information obtained about the position of the non-volatile storage element; pre-charging a charge storage device in a sensing circuit, the charge storage device is in communication with a bit line, the non-volatile storage element is in communication with the bit line; pre-charging the charge storage device to the determined pre-charge voltage; applying a reference signal to the non-volatile storage element while maintaining a constant the voltage level on the bit line; and after commencing the applying of the reference signal, waiting the determined duration of time and then sensing whether current conducted by the non-volatile element during the determined duration exceeds a pre-determined value in response to the reference signal while maintaining a constant voltage level on the bit line.

One embodiment comprises a method for sensing a non-volatile storage element comprising: obtaining information about the position of the non-volatile storage element; determining a pre-charge voltage for a charge storage device in the sensing circuit based on the information obtained about the position of the non-volatile storage element, the charge storage device is in communication with a bit line, the non-volatile storage element is in communication with the sensing circuit; pre-charging the charge storage device to the determined pre-charge voltage; applying a reference signal to the non-volatile storage element while maintaining a constant voltage level on the bit line; and after commencing the applying of the reference signal, waiting a predetermined duration of time and then sensing whether current conducted by the non-volatile element exceeds a pre-determined value in response to the reference signal while maintaining a constant voltage level on the bit line.

One embodiment comprises a non-volatile storage system, comprising: a plurality of non-volatile storage elements; a plurality of bit lines connected to the non-volatile storage elements; one or more managing circuits in communication with the non-volatile storage elements to program the non-volatile storage elements, the one or more managing circuits include one or more sensing circuits to verify and read one or more non-volatile storage elements while maintaining constant the voltage levels on the bit lines connected to the non-volatile storage elements, the one or more sensing circuits each comprise: a charge storage device, a pre-charging circuit in communication with the charge storage device in order to pre-charge the charge storage device, a bit line connection circuit that includes a communication switch that cuts off and connects the bit line to the charge storage device so that the charge storage device is capable of discharging the pre-charge through the bit line and the non-volatile storage element being sensed, a result detection circuit that determines a state of the charge storage device, a strobe timer circuit in communication with the result detection circuit, after a duration of time during a sensing operation the strobe timer circuit instructs the result detection circuit to respond to the state of the charge storage device, and a strobe time determination circuit in communication with the strobe timer circuit that, based on information about the position of the non-volatile element being sensed, determines the duration of time after which the strobe timer circuit will instruct the result detection circuit to respond to the state of the charge storage device.

One embodiment comprises a non-volatile storage system, comprising: a plurality of non-volatile storage elements; a plurality of bit lines connected to the non-volatile storage elements; one or more managing circuits in communication with the non-volatile storage elements to program the non-volatile storage elements, the one or more managing circuits include one or more sensing circuits to verify and read the non-volatile storage elements while maintaining constant voltage levels on the bit lines connected to the non-volatile storage elements, the one or more sensing circuits each comprise: a charge storage device, a pre-charging circuit in communication with the charge storage device in order to pre-charge the charge storage device, a bit line connection circuit that includes a communication switch that cuts off and connects the bit line to the charge storage device so that the charge storage device is capable of discharging the pre-charge through the bit line and the non-volatile storage element being sensed, a result detection circuit that determines a state of the charge storage device; an adjustable voltage circuit in communication with the pre-charging circuit, the adjustable voltage circuit, based on information about the position of the non-volatile element being sensed, determines the pre-charge voltage to which the pre-charge circuit pre-charges the charge storage device, and a strobe timer circuit in communication with the result detection circuit, after a duration of time during a sensing operation the strobe timer circuit instructs the result detection circuit to respond to the state of the charge storage device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for sensing a non-volatile storage element, comprising:
   obtaining information about the position of the non-volatile storage element, the non-volatile storage element is part of a three dimensional memory array, the non-volatile storage element has a charge storage area above a semiconductor substrate;
   determining a sensing parameter, at least in part based on the information obtained about the position of the non-volatile storage element;
   pre-charging a charge storage device in a sensing circuit, the charge storage device is in communication with a bit line, the non-volatile storage element is in communication with the bit line;
   applying a reference signal to the non-volatile storage element while maintaining a constant voltage level on the bit line; and
   based on the determined sensing parameter, sensing whether current conducted by the non-volatile element exceeds a pre-determined value in response to the reference signal while maintaining a constant voltage level on the bit line;
   the obtaining, determining, pre-charging, applying and sensing is performed by circuitry in communication with the non-volatile storage element.

2. The method of claim 1, wherein:
   the sensing comprises verifying programming of the non-volatile storage element.

3. The method of claim 1, wherein:
   the sensing comprises performing a read operation for the non-volatile storage element.

4. The method of claim 1, wherein:
the obtaining information about the position of the non-volatile storage element comprises determining information about the position of the non-volatile storage element with respect to the sensing circuit.

5. The method of claim 1, wherein:
the obtaining information about the position of the non-volatile storage element comprises obtaining the block address of the non-volatile storage element.

6. The method of claim 1, wherein:
the obtaining information about the position of the non-volatile storage element comprises obtaining the word line address of the non-volatile storage element.

7. The method of claim 1, wherein:
the sensing parameter comprises a duration of time for which the non-volatile storage element may be sensed.

8. The method of claim 1, wherein:
the sensing parameter comprises a pre-charge voltage to which the charge storage device is charged.

9. The method of claim 1, wherein:
the applying a reference signal to the non-volatile storage element comprises applying a voltage to the control gate of the non-volatile storage element.

10. A non-volatile storage system, comprising:
a three dimensional memory structure comprising a plurality of non-volatile storage elements, the non-volatile storage elements have a charge storage area above a semiconductor substrate;
a plurality of bit lines connected to the non-volatile storage elements;
one or more managing circuits in communication with the non-volatile storage elements, the one or more managing circuits include a sensing circuit, the one or more managing circuits are configured to obtain information about the distance of a non-volatile storage element from the sensing circuit, the one or more managing circuits are configured to determine a sensing parameter at least in part based on the information obtained about the distance of the non-volatile storage element from the sensing circuit and configure a sensing process for the sensing circuit based on the determined sensing parameter;
to perform the configured sensing process the one or more managing circuits are configured to pre-charge a charge storage device in the sensing circuit, apply a reference signal to the non-volatile storage element and sense whether current conducted by the non-volatile element exceeds a pre-determined value while maintaining a constant voltage level on a bit line, the charge storage device is in communication with the bit line, the non-volatile storage element is in communication with the bit line.

11. The non-volatile storage system of claim 10, wherein:
the non-volatile storage elements comprise NAND flash memory cells.

12. The non-volatile storage system of claim 10, wherein:
the sensing parameter comprises a duration of time for which the non-volatile storage element may be sensed.

13. The non-volatile storage system of claim 10, wherein:
the sensing parameter comprises a pre-charge voltage to which the charge storage device is charged.

14. A non-volatile storage system, comprising:
a three dimensional memory structure comprising a plurality of non-volatile storage elements, the non-volatile storage elements have a charge storage area above a semiconductor substrate;
a plurality of bit lines connected to the non-volatile storage elements;
one or more managing circuits in communication with the non-volatile storage elements to program the non-volatile storage elements, the one or more managing circuits include one or more sensing circuits to verify and read one or more non-volatile storage elements while maintaining constant the voltage levels on the bit lines connected to the non-volatile storage elements, the one or more sensing circuits each comprise:
a charge storage device,
a pre-charging circuit in communication with the charge storage device in order to pre-charge the charge storage device,
a bit line connection circuit that includes a communication switch that cuts off and connects the bit line to the charge storage device so that the charge storage device is capable of discharging the pre-charge through the bit line and the non-volatile storage element being sensed,
a result detection circuit that determines a state of the charge storage device,
a strobe timer circuit in communication with the result detection circuit, after a duration of time during a sensing operation the strobe timer circuit instructs the result detection circuit to respond to the state of the charge storage device, and
a strobe time determination circuit in communication with the strobe timer circuit that, based on information about the position of the non-volatile element being sensed, determines the duration of time after which the strobe timer circuit will instruct the result detection circuit to respond to the state of the charge storage device.

15. The non-volatile storage system of claim 14 wherein:
the charge storage device comprises one or more capacitors.

16. The non-volatile storage system of claim 14 wherein:
the position of the non-volatile storage element is with respect to a respective sensing circuit.

17. A non-volatile storage system, comprising:
a three dimensional memory structure comprising a plurality of non-volatile storage elements, the non-volatile storage elements have a charge storage area above a semiconductor substrate;
a plurality of bit lines connected to the non-volatile storage elements;
one or more managing circuits in communication with the non-volatile storage elements to program the non-volatile storage elements, the one or more managing circuits include one or more sensing circuits to verify and read the non-volatile storage elements while maintaining constant voltage levels on the bit lines connected to the non-volatile storage elements, the one or more sensing circuits each comprise:
a charge storage device,
a pre-charging circuit in communication with the charge storage device in order to pre-charge the charge storage device,
a bit line connection circuit that includes a communication switch that cuts off and connects the bit line to the charge storage device so that the charge storage device is capable of discharging the pre-charge through the bit line and the non-volatile storage element,
a result detection circuit that determines a state of the charge storage device;

an adjustable voltage circuit in communication with the pre-charging circuit, the adjustable voltage circuit, based on information about the position of the non-volatile element being sensed, determines the pre-charge voltage to which the pre-charge circuit pre-charges the charge storage device, and a strobe timer circuit in communication with the result detection circuit, after a duration of time during a sensing operation the strobe timer circuit instructs the result detection circuit to respond to the state of the charge storage device.

18. The non-volatile storage system of claim 17 wherein:

the charge storage device comprises one or more capacitors; and the position of the non-volatile storage element is with respect to a respective sensing circuit.

* * * * *